(12) United States Patent
Fiorenza et al.

(10) Patent No.: US 9,484,434 B2
(45) Date of Patent: Nov. 1, 2016

(54) INDUCEMENT OF STRAIN IN A SEMICONDUCTOR LAYER

(71) Applicant: Taiwan Semiconductor Manufacturing Company, Ltd., Hsin-Chu (TW)

(72) Inventors: James Fiorenza, Wilmington, MA (US); Mark Carroll, Charlestown, MA (US); Anthony J. Lochtefeld, Ipswich, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 169 days.

(21) Appl. No.: 14/103,521

(22) Filed: Dec. 11, 2013

(65) Prior Publication Data

US 2014/0147981 A1 May 29, 2014

Related U.S. Application Data

(62) Division of application No. 13/013,082, filed on Jan. 25, 2011, now Pat. No. 8,624,319, which is a division of application No. 11/952,514, filed on Dec. 7, 2007, now Pat. No. 7,897,493.

(60) Provisional application No. 60/873,899, filed on Dec. 8, 2006.

(51) Int. Cl.
| | | |
|---|---|---|
| *H01L 27/12* | (2006.01) | |
| *H01L 29/66* | (2006.01) | |
| *H01L 21/265* | (2006.01) | |
| *H01L 21/324* | (2006.01) | |
| *H01L 29/10* | (2006.01) | |
| *H01L 29/78* | (2006.01) | |
| *H01L 29/786* | (2006.01) | |
| *H01L 21/02* | (2006.01) | |
| *H01L 29/165* | (2006.01) | |

(52) U.S. Cl.
CPC ... *H01L 29/66636* (2013.01); *H01L 21/02667* (2013.01); *H01L 21/26506* (2013.01); *H01L 21/324* (2013.01); *H01L 29/1054* (2013.01); *H01L 29/6653* (2013.01); *H01L 29/7842* (2013.01); *H01L 29/7843* (2013.01); *H01L 29/7845* (2013.01); *H01L 29/7848* (2013.01); *H01L 29/78687* (2013.01); *H01L 29/165* (2013.01)

(58) Field of Classification Search
CPC ............... H01L 21/26506; H01L 21/823807; H01L 29/7848; H01L 29/7833
See application file for complete search history.

(56) References Cited

U.S. PATENT DOCUMENTS

| | | | | |
|---|---|---|---|---|
| 6,621,131 B2 * | 9/2003 | Murthy | ............... | H01L 29/1054 257/192 |
| 6,689,671 B1 * | 2/2004 | Yu | ..................... | H01L 21/02381 257/E21.129 |
| 6,893,936 B1 * | 5/2005 | Chen | ................. | H01L 21/76254 257/E21.568 |
| 6,905,923 B1 * | 6/2005 | Paton | .............. | H01L 21/823807 257/E21.633 |

(Continued)

*Primary Examiner* — Zandra Smith
*Assistant Examiner* — John M Parker
(74) *Attorney, Agent, or Firm* — Slater Matsil, LLP

(57) ABSTRACT

Strain is induced in a semiconductor layer. Embodiments include inducing strain by, for example, creation of free surfaces.

21 Claims, 25 Drawing Sheets

(56) References Cited

U.S. PATENT DOCUMENTS

| | | | |
|---|---|---|---|
| 7,037,795 B1 * | 5/2006 | Barr | H01L 29/66636 257/E21.415 |
| 7,138,310 B2 * | 11/2006 | Currie | H01L 21/823807 257/E21.129 |
| 7,524,740 B1 * | 4/2009 | Liu | H01L 21/02532 438/479 |
| 7,662,701 B2 * | 2/2010 | Forbes | H01L 21/26506 257/E21.32 |
| 2006/0046366 A1 * | 3/2006 | Orlowski | H01L 29/0653 438/198 |
| 2006/0205167 A1 * | 9/2006 | Kavalieros | H01L 21/823807 438/300 |
| 2007/0145481 A1 * | 6/2007 | Tilke | H01L 21/76251 257/347 |
| 2008/0119019 A1 * | 5/2008 | Han | H01L 21/823807 438/197 |
| 2008/0179636 A1 * | 7/2008 | Chidambarrao | H01L 21/26513 257/255 |

* cited by examiner

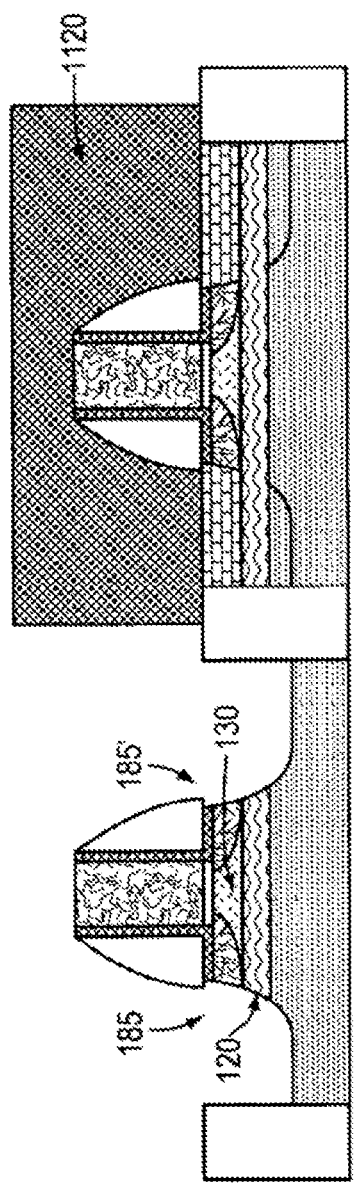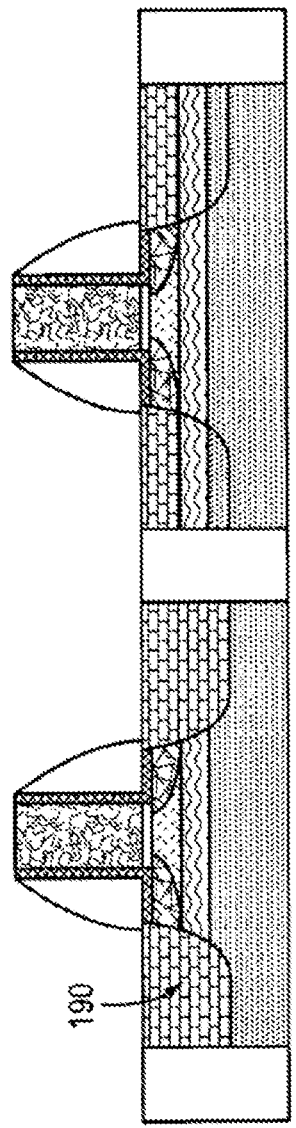
FIG. 11D
FIG. 11E

INDUCEMENT OF STRAIN IN A SEMICONDUCTOR LAYER

RELATED APPLICATIONS

This application is a divisional of U.S. patent application Ser. No. 13/013,082, filed on Jan. 25, 2011, entitled "Inducement of Strain in a Semiconductor Layer," which is a divisional of U.S. patent application Ser. No. 11/952,514, filed on Dec. 7, 2007, entitled "Inducement of Strain in a Semiconductor Layer," which claims the benefit of and priority to U.S. Provisional Application Ser. No. 60/873,899, filed Dec. 8, 2006; the disclosures of these applications are hereby incorporated by reference in their entireties.

BACKGROUND AND SUMMARY

Stress engineering is an important technique for enhancing the performance of sub-100 nanometer (nm) metal-oxide semiconductor field-effect transistors (MOSFETs), and a variety of stress-inducing techniques have been developed. Earlier techniques have limitations; specifically, the magnitude of stress that a technique may deliver may not be sufficiently large. Also, for many previously developed techniques, the channel stress decreases as the device is scaled up. Therefore, there is continued interest in strain-inducing techniques that can provide large magnitudes of strain in the channel and whose effectiveness is not decreased with increased scaling.

A technique is provided for inducing strain in a MOSFET channel by using elastic relaxation of a thin, buried strained layer (e.g., a SiGe layer) to induce tensile strain in an overlying layer (e.g., a Si layer). Embodiments include relaxation via an creation of a free surface via an amorphization implant and anneal and/or removal of semiconductor material, creation of a free surface on top of a channel by amorphization and anneal of the gate and/or removal of a sidewall spacer, the use of an unusually large sidewall spacer to increase the strain for very short gate lengths, utilization of other strain-inducing techniques including stress memorization, and implementation of the technique on a strained semiconductor-on-insulator (SSOI) substrate or strained silicon on a SiGe graded buffer to reduce plastic relaxation of originally present strain.

The effectiveness of this technique is demonstrated through stress simulations of MOSFETs with a buried SiGe layer. The simulations were executed for different values of the key determinant of channel stress in a particular material system: a SiGe layer stress, a SiGe layer thickness, and an overlying silicon layer thickness. The design space is explored from $L_g$=25 nm to $L_g$=9 nm. More specifically, stress simulations were undertaken to examine the effectiveness of the technique in delivering stress to MOSFETs from the ITRS 65 nm node ($L_g$=32 nm) through the 22 nm node ($L_g$=13 nm). These simulations examined the preferred thicknesses of the two most important layers of the structure, the SiGe layer and the silicon layer disposed thereover, across technology generations. Large average stress levels [exceeding 1 gigapascal (GPa)] may be achieved using practically relevant thicknesses of silicon and SiGe. Significantly, the stress level appears to increase with decreasing gate length, so the technique is particularly relevant for future technology nodes.

In an aspect, the invention features a method for forming a structure. Embodiments of the method include forming a first crystalline strained semiconductor layer having a first lattice constant over a substrate. A second crystalline semiconductor layer having a second lattice constant different from the first lattice constant is formed on a top surface of the first crystalline semiconductor layer. A portion of the first crystalline semiconductor layer and a portion of the second crystalline semiconductor layer are amorphized and annealed to induce a change in the strain in the first crystalline semiconductor layer and in the second crystalline semiconductor layer.

One or more of the following features may be included. Amorphizing may include performing an amorphization implant, and/or annealing may include a rapid thermal anneal. The first crystalline semiconductor layer may include an alloy of silicon and germanium, or it may consist essentially of silicon.

Preferably, the substrate is, e.g., (100) silicon, a strained-silicon-on-insulator substrate or a strained-semiconductor-on-insulator substrate. A thickness of the first crystalline semiconductor layer may be greater than a critical thickness of the first crystalline semiconductor layer disposed over silicon.

In some embodiments, a thickness of the first semiconductor layer is greater than a critical thickness and annealing is performed at a temperature sufficiently low to prevent relaxation of the first semiconductor layer.

The structure may include an n-type field-effect transistor (N-FET). A strain-inducing overlayer may be disposed above the first crystalline semiconductor layer. The amorphized region may include a source or a drain of a field-effect transistor (FET).

In another aspect of the invention, a method for forming a structure is provided. In an embodiment, a first crystalline semiconductor layer is formed over a substrate, the first crystalline semiconductor layer being strained and having a first lattice constant. A second crystalline semiconductor layer is formed on a top surface of the first layer, the second crystalline semiconductor layer having a lattice constant different from the first lattice constant. A transistor is defined including a gate electrode, a source, a drain, and a channel region, the channel region including at least a portion of the second crystalline semiconductor layer. At least a portion of the gate electrode, source, and/or drain is amorphized to induce strain in the channel region.

Yet another aspect of the invention features a method for forming a structure. In an embodiment, a first crystalline semiconductor layer that is strained and has a first lattice constant is formed over a substrate. A second crystalline semiconductor layer having a lattice constant different from the first lattice constant is formed on a top surface of the first crystalline semiconductor layer. A transistor including a gate electrode disposed above the second crystalline semiconductor layer is formed, as well as a sidewall spacer adjacent the gate electrode, and a channel region disposed below the gate electrode and at least partially in the second crystalline semiconductor layer. A free surface is created above the channel region in the gate electrode and/or the sidewall spacer. The free surface induces strain in at least a portion of the channel region disposed in the second crystalline semiconductor layer.

Creating the free surface above the channel region may induce relaxation of strain in the first crystalline semiconductor layer disposed below the channel region. Creating the free surface may include removing the sidewall spacer and/or amorphizing and annealing at least a portion of the gate electrode. In some embodiments, the gate electrode may include an amorphous material. A strain-inducing overlayer may be formed above the first crystalline semiconductor layer.

In still another aspect, the invention involves a method for forming a structure. In an embodiment, a first crystalline tensilely strained semiconductor layer having a first lattice constant is formed over a substrate. A second crystalline semiconductor layer having a second lattice constant different from the first lattice constant is formed on a top surface of the first crystalline semiconductor layer. A transistor including a gate electrode, a source, a drain, and a channel region, is defined, with the channel region including at least a portion of the second crystalline semiconductor layer. A free surface is created in the gate electrode, source, and/or drain, with the free surface inducing compressive strain in the channel region.

The free surface may be created by amorphizing at least a portion of the gate electrode, source, and/or drain. In some embodiments, the free surface is created by removing at least a portion of the gate electrode, source, and/or drain.

Another aspect of the invention features a method for forming a structure. In various embodiments, first and second shallow trench isolation (STI) regions are formed in a substrate. A first strained crystalline semiconductor layer having a first lattice constant is formed over the substrate between the first and second STI regions. A second crystalline semiconductor layer having a second lattice constant different from the first lattice constant is formed on a top surface of the first crystalline semiconductor layer between the first and second STI regions. A first free surface is created in the first and second crystalline semiconductor layers, and a second free surface is created in the first and/or second STI regions. The first and second free surfaces induce a change in the strain in the first crystalline semiconductor layer and induce strain in the second crystalline semiconductor layer.

Creating the free surface in the first and second crystalline semiconductor layers may include amorphizing a portion of each of the first and second crystalline semiconductor layers or removing at least a portion of each of the first and second crystalline semiconductor layers. A FET having a channel region including at least a portion of the second crystalline semiconductor layer may be formed.

In still another aspect, the invention includes a method for forming a structure. In an embodiment, a first strained crystalline semiconductor layer having a first lattice constant is formed over a substrate. A second crystalline semiconductor layer having a second lattice constant different from the first lattice constant is formed on a top surface of the first layer. A transistor is formed, including (i) a gate electrode disposed above the second crystalline semiconductor layer, (ii) a sacrificial sidewall spacer adjacent the gate electrode, the sacrificial sidewall spacer having a first width, and (iii) a channel region disposed below the gate electrode, the channel region including at least a portion of the second crystalline semiconductor layer. At least a portion of the sacrificial sidewall spacer is removed to induce strain in the channel region disposed in the second crystalline semiconductor layer. A device sidewall spacer proximate the gate electrode is defined, the device sidewall spacer having a second width smaller than the first width.

In another aspect, the invention features a method for forming a structure. Embodiments include forming a first strained semiconductor layer including a first semiconductor material over a substrate comprising a crystalline material. A second relaxed semiconductor layer, including a second semiconductor material, is formed over the first semiconductor layer. A metal gate electrode is formed over the second semiconductor layer. The metal gate electrode is annealed to a temperature sufficient to allow stress relaxation in the metal gate electrode. Annealing the metal gate electrode relaxes at least a portion of the first semiconductor layer, and relaxation of the first semiconductor layer portion induces strain in at least a portion of the second semiconductor layer.

In yet another aspect, the invention features a structure. In an embodiment, the structure includes a first layer includes a first strained semiconductor material disposed above a substrate. A second layer, including a second semiconductor material different from the first semiconductor material, is disposed on the first layer. A transistor gate electrode and a sidewall spacer are disposed above the second layer, the gate electrode and sidewall spacer defining a first region disposed thereunder and including a first portion of each of the first and second layers. A second region is disposed laterally and spaced apart from the first region, extends into the first and second layers, and comprising a third material. The composition and/or defect density of the second region is different from a composition and/or defect density of the first region.

One or more of the following features may be included. The third material may be the same as the first semiconductor material or the second semiconductor material. The third material may be different from the first and second semiconductor materials. The third material may include a second portion of each of the first and second layers, the second portions having substantially higher crystalline defect densities than the first portions. A strain-inducing overlayer may be disposed above the first layer, the gate electrode, and sidewall spacer.

BRIEF DESCRIPTION OF FIGURES

FIGS. 11a-11e are cross-sectional views illustrating a fabrication process to combine a strained surface layer NMOSFET device with a buried strained layer PMOSFET device;

DETAILED DESCRIPTION

Referring to FIGS. 1a-1e, the fabrication process of a buried layer strain-inducing technique, in accordance with an embodiment of the invention, may proceed as follows. A substrate 100 may includes a crystalline semiconductor material. The substrate 100 may be, for example, a bulk silicon wafer, a bulk germanium wafer, an SOI substrate, or an SSOI substrate. The substrate 100 may include or consist essentially of a semiconductor material, such as a group IV element, e.g., germanium or silicon. In an embodiment, substrate 100 includes or consists essentially of (100) silicon.

Substrate 100 is processed through a typical CMOS fabrication process up to and including the formation of first and second shallow trench isolation (STI) regions 110, 110' that define an active area therebetween and also provide isolation between subsequently formed adjacent devices. Each of the STI regions 110, 110' includes a dielectric material, e.g., silicon dioxide ($SiO_2$) or silicon nitride ($Si_3N_4$), disposed therein.

The STI regions may be formed using techniques well known in the art, for example as follows. Shallow trenches are etched into the substrate using a mask, e.g., a silicon nitride mask. The trenches may be filled with an oxide. The oxide material may be planarized by, e.g., chemical mechanical polishing, and the mask removed to reveal active areas disposed between the trenches.

The substrate 100 may be n-type doped or p-type doped and may include n-type wells where p-type MOSFETs may be formed; p-type wells where n-type MOSFETs may be formed; or twin wells (both n-type and p-type wells). The active areas may be implanted with an n-type or p-type implant to adjust the threshold voltage of the subsequently formed transistors.

Figure 1A:
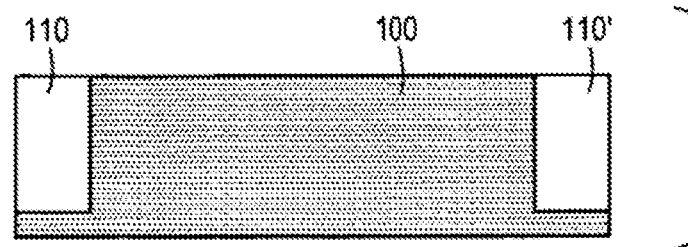
FIGS. 1a-1f are cross-sectional views illustrating the fabrication of structures in accordance with an embodiment of an invention.
Figure 1B:
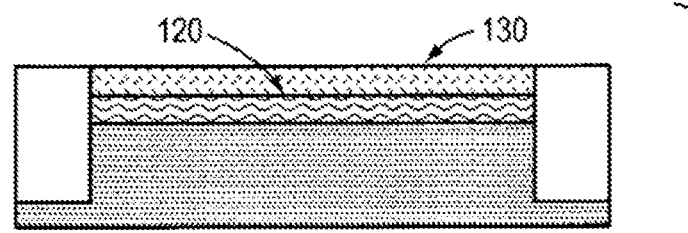

As shown in FIG. 1b, a first semiconductor layer 120 is formed selectively over the crystalline semiconductor substrate 100, e.g., over an exposed portion of the substrate 100 disposed between two STI regions 110, 110'. The first semiconductor layer 120 includes a first semiconductor material and is strained. A second semiconductor layer 130 is formed over the first semiconductor layer 120. The second semiconductor layer 130 includes a second semiconductor material and is relaxed. The first and second semiconductor layers may be formed on all of the active area regions on the substrate. In another embodiment, a masking layer may be deposited and patterned so that the first and second semiconductor layers are only formed on some of the active area regions. For example, the active areas in which PMOSFETs will subsequently be formed may be covered, while those in which the NMOSFETs will subsequently be formed may be revealed, so that the first and second semiconductor layers are only grown in the NMOSFET active areas and not in the PMOSFET active areas. In an embodiment, at least a top portion of substrate 100 consists essentially of relaxed Si, the first semiconductor layer 120 includes compressively strained SiGe and the second semiconductor layer 130 includes relaxed Si. In another embodiment, the first semiconductor material includes tensilely strained SiC and the second semiconductor material includes Si. In some embodiments, prior to the formation of the first semiconductor layer 120, the exposed portion of the substrate 100 disposed between two STI regions 110, 110' is etched back slightly prior to the formation of the first semiconductor layer 120, such that a top surface of the second semiconductor layers 130 is co-planar with a top surface of the STI regions 110, 110'.

In an embodiment, the substrate 100 is a strained-silicon-on-insulator substrate, and a thickness of the first crystalline semiconductor layer is greater than a critical thickness of the first crystalline semiconductor layer disposed over silicon. In some embodiments, the thickness of the first semiconductor layer may range from 5 nm to 50 nm, e.g., 12 nm, and a thickness of the second semiconductor layer may range from 1 nm to 25 nm, e.g., 6 nm. For more effective inducement of strain, the top second semiconductor layer is as thin as practically possible, and the underlying first semiconductor layer is as thick as practically possible. However, if the second semiconductor layer is too thin, carrier mobility may decrease, and if the first semiconductor layer is too thick, dislocations may be generated, thereby possibly causing transistor leakage.

The first crystalline semiconductor layer may have a first lattice constant and the second crystalline semiconductor may have a second lattice constant that is different from the first lattice constant.

Figure 1C:
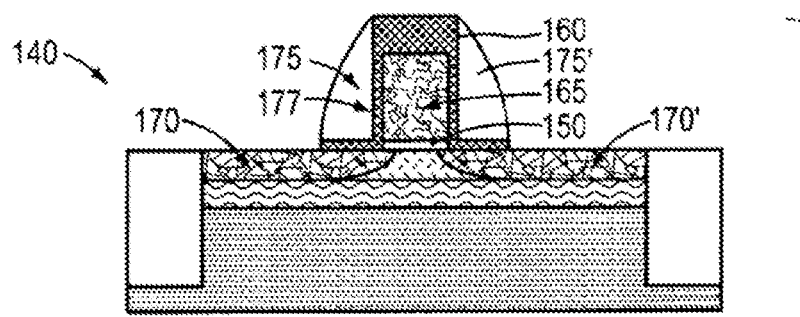

Referring to FIG. 1c, a transistor 140 is formed over the substrate 100, first semiconductor layer 120, and second semiconductor layer 130, in accordance with methods known to one of skill in the art. Formation of the transistor 140 may include growing a gate dielectric layer, e.g., silicon dioxide, silicon oxy-nitride or a high-k dielectric 150, followed by the formation of a gate electrode layer, e.g., polysilicon or metal. A masking layer 160, e.g., silicon nitride, may be disposed over the gate electrode layer. The gate electrode layer and masking layer 160 are etched to define a gate electrode 165. A shallow ion implant is performed to define source and drain extension regions 170, 170'. A halo implant of opposite type (for example p-type if the extension is n-type) can be performed to control short-channel effects (the halo implant is not shown). The depths of the source and drain extension regions 170, 170' are typically less than about 10 nm. Sidewall spacers 175, 175', formed from, e.g., silicon dioxide disposed over a silicon nitride layer 177, are defined proximate the gate electrode 165 and over portions of the source and drain extension regions 170, 170'.

Figure 1D:
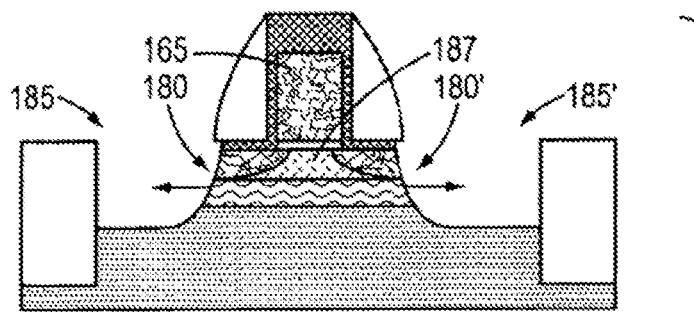

As shown in FIG. 1d, free surfaces 180, 180' are defined by etching through portions of the first and second semiconductor layers 120, 130 proximate sidewall spacers 175, 175' by, e.g., a reactive ion etch or a selective wet etch. Thus, at least a portion of each of the first and second semiconductor layers 120, 130 is removed to define recesses 185, 185'. The free surfaces 180, 180' are configured to allow relaxation of at least a portion of the strained first semiconductor layer 120, i.e., the free surfaces are positioned to allow lateral expansion of the first semiconductor layer 120. An edge of the first semiconductor layer 120, i.e., a buried layer, is thereby exposed. The relaxation of the first semiconductor layer 120 induces strain in at least a portion of the overlying second semiconductor layer. A channel 187 may be defined in the second semiconductor layer 130 under the gate electrode 165. In the illustrated embodiment, the free surfaces 180, 180' are lateral free surfaces.

Figure 1E:
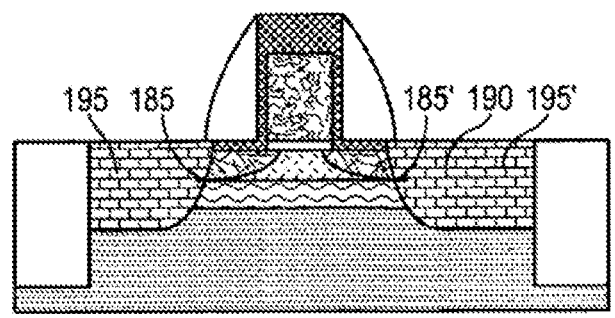

Referring to FIG. 1e, a third semiconductor material 190 is re-grown in the recesses 185, 185'. The third semiconductor material 190 may be relaxed and may include substantially the same material as the substrate, e.g., Si. In an embodiment, the relaxed third semiconductor material 190 has a lattice constant less than the lattice constant of the substrate material and induces tensile strain in the second semiconductor layer 130. For example, the substrate 100 may include or consist essentially of Si, and the third semiconductor material 190 may include or consist essentially of SiC. In another embodiment, the relaxed third semiconductor material 190 has a lattice constant greater than the lattice constant of the substrate material and may induce compressive strain in the second semiconductor layer. For example, the substrate 100 may include or consist essentially of Si, and the third semiconductor material 190 may include or consist essentially of SiGe.

The third semiconductor material 190 may be doped n- or p-type to define source and drain regions 195, 195'. The n-type/p-type doping may include arsenic and/or phosphorous/boron dopants and with a peak concentration of greater than $10^{20}/cm^2$ and have a junction depth of about 90 nm. An activation anneal may be performed, and a CMOS process may be completed by metallization and definition of contacts (not shown).

Figure 1F:
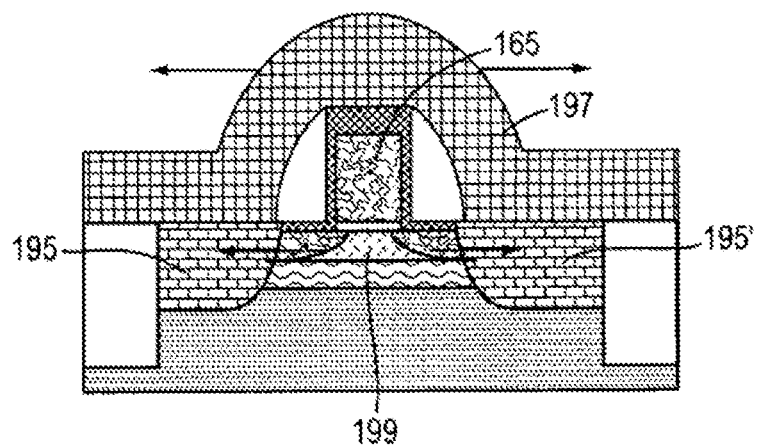

FIG. 1f illustrates an alternative embodiment in which, after the definition of source and drain regions 195, 195' and an activation anneal, a metal-semiconductor alloy, e.g., a silicide (not shown), is formed over the source and drain regions 195, 195, in accordance with methods known to those of skill in the art. A strained layer 197 is deposited over the gate electrode 165 and source and drain regions 195, 195'. The strained layer 197 may include, e.g., tensilely strained silicon nitride. The strained layer 197 induces strain in the underlying transistor 140, including in a channel 199 disposed under the gate electrode 165.

As shown in FIGS. 1a-1f, in some embodiments, the physical mechanism by which stress is induced in silicon is enabled by elastic deformation of a high aspect ratio Si/SiGe/Si stack created by the etch step. In terms of the fabrication process, the technique is similar to the SiGe source/drain stress technique widely used for PMOSFET fabrication. All tools and unit processes, therefore, suitable for implementing this technique are commonly available in a modern CMOS fabrication facility.

Figure 2A:
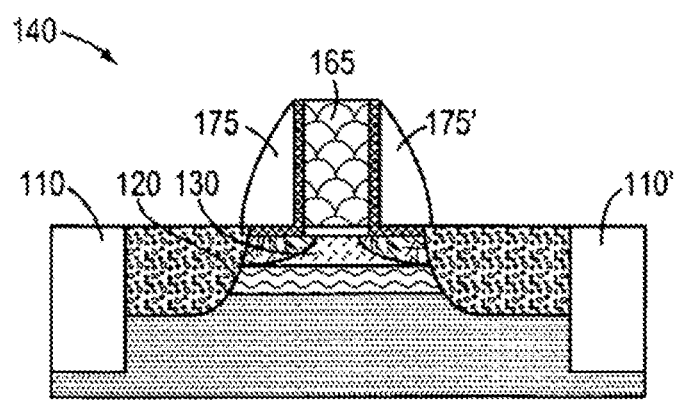
FIGS. 2a-2d, 3a-3b, and 4a-4c are cross-sectional views illustrating the fabrication of structures in accordance with other embodiments of the invention.
Figure 2B:
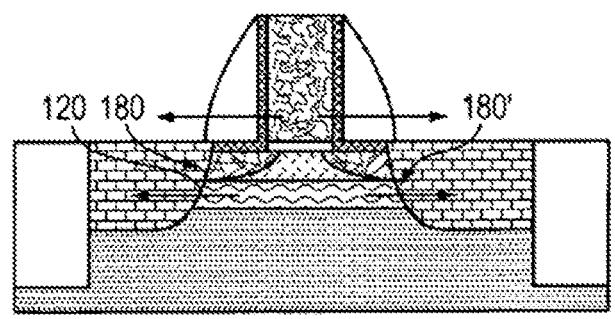

Referring to FIGS. 2a-2b, an alternative method for defining free surface 180 includes performing an amorphization implant and a subsequent thermal annealing step. Transistor 140 may be processed through the processing point illustrated in FIG. 1c, i.e., through the fabrication of the gate electrode 165 and source and drain extension regions 170, 170', but without forming masking layer 160 over the gate electrode 165. An amorphization implant is performed to amorphize crystalline material in the gate electrode 165 and in portions of the crystalline first and second semiconductor layers 120, 130 and substrate 100 disposed between the sidewall spacers 175, 175' and STI regions 110, 110'. Typical parameters for an appropriate amorphization implant may be, for example, a germanium implant with an energy of 60 keV and a dose of $5\times10^{15}/cm^2$.

After the amorphization implant, a thermal anneal is performed to recrystallize the amorphized portions of the gate electrode 165 and first and second semiconductor layers 120, 130. Exemplary parameters for the thermal anneal are, e.g., a 1 second spike anneal at 1100° C. The recrystallization of the amorphized materials creates the free surfaces 180, 180' proximate the first semiconductor layer 120 in the source and drain regions, as well as in the overlying gate electrode 165, and allows the portion of the first semiconductor layer 120 underlying the gate electrode 165 to relax and expand, thereby inducing strain in the overlying portion of the second semiconductor layer 130. Additionally, the amorphization of the gate enables a higher level of strain to be transferred to the channel because a free surface is created on top of the channel, as well as adjacent to the channel. Because of amorphization, the channel is not constrained by the gate material, allowing the second semiconductor layer to be strained more effectively by the first semiconductor layer. CMOS processing may be completed by metallization and definition of contacts (not shown).

Figure 2C:
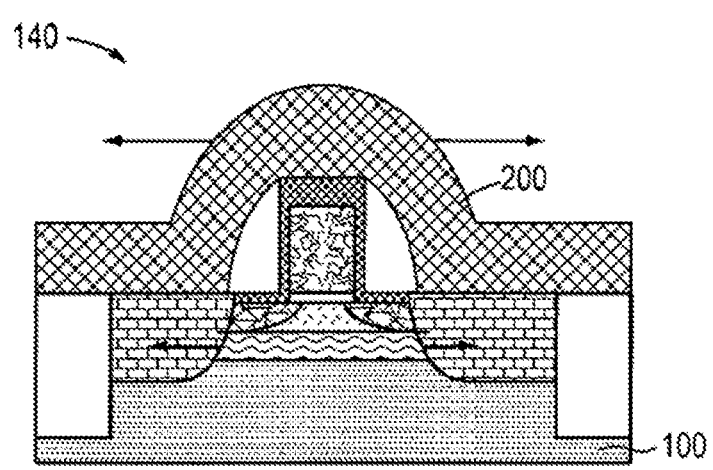
Figure 2D:
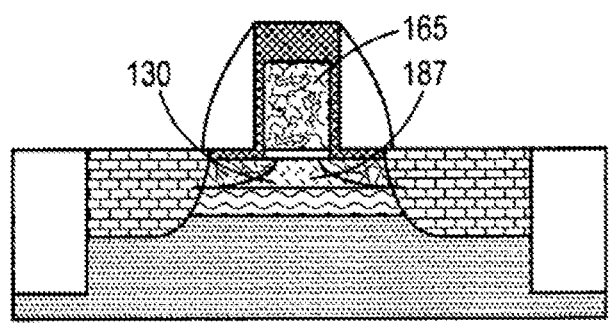

Referring to FIG. 2c-2d, in some embodiments, additional strain is induced by means of stress memorization. A strain-inducing layer 200 is deposited over the transistor 140 after amorphization of the gate, source, and drain but before a thermal anneal. The strain-inducing layer 200 may be tensilely strained. For example, if the substrate 100 is Si, then the strain-inducing layer 200 may comprise or consist essentially of $Si_3N_4$. A thermal anneal is then performed to re-crystallize the gate, source, and drain, and create a free surface adjacent to the channel in the source and drain and above the channel in the gate. Strain is transferred both to the channel and to the gate from both the underlying strained layer and the overlying strained layer.

Subsequently, the strain-inducing layer 200 is removed. Because of stress memorization, strain remains in the gate, causing additional strain in the second semiconductor layer 130 disposed under the gate electrode 165 and the channel 187. A CMOS process may be completed by metallization and definition of contacts (not shown).

Stress memorization may be especially effective in combination with the strained buried layer technique. In many embodiments, the total effect of combining two strain-inducing techniques is linear, i.e., the strain in the channel as a result of the combination of the techniques is equal to the strain in the channel using the first technique plus the strain in the channel using the second technique. However, the combination of stress memorization and the strained buried layer may be super-linear, i.e., the strain in the combination may be greater than the strain obtained by only using stress memorization plus the strain obtained by only using the strained buried layer technique. The reason for this behavior is that the two techniques naturally reinforce one another. The stress memorization technique naturally provides a free surface on the top of the channel, therefore more strain is induced in the channel by the first semiconductor layer than if stress memorization was not used. Conversely, the strain in the first buried layer adds strain to the gate during the anneal step of stress memorization. Therefore, more strain may be incorporated into the gate, and therefore the channel as well, when stress memorization is combined with the strained buried layer technique, than when it is implemented without the strained buried layer technique.

Figure 3A:
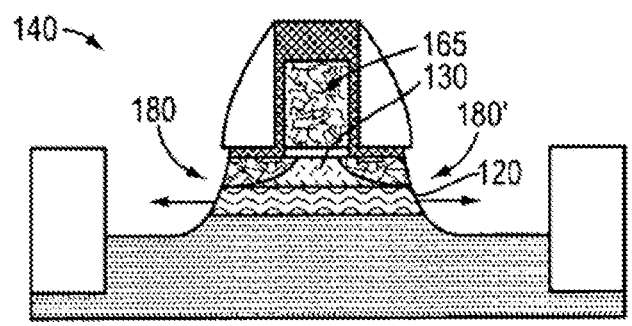
Figure 3B:
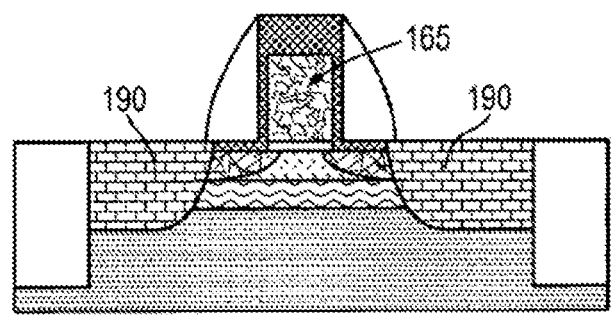

Referring to FIGS. 3a-3b, an alternative method for defining free surface 180 includes performing an amorphization implant to amorphize the gate electrode and create a free surface in the source/drain regions by defining recesses. Transistor 140 may be processed through the processing point illustrated in FIG. 1c, i.e., through the fabrication of the gate electrode 165 and source and drain extension regions 170, 170', and including masking layer 160 over the gate electrode 165. An amorphization implant is performed to amorphize crystalline material in the gate electrode 165. Typical parameters for an appropriate amorphization implant may be, for example, a germanium implant with an energy of 20 keV and a dose of $1\times10^{15}/cm^2$.

Either prior or subsequent to the amorphization implant, portions of the crystalline first and second semiconductor layers 120, 130 and substrate 100 disposed between the sidewall spacers 175, 175' and STI regions 110, 110' are removed to define recesses 185, 185' and free surfaces 180, 180'. The recesses may be defined by, e.g., a reactive ion etch or a selective wet etch. The free surfaces 180, 180' are positioned to allow relaxation of at least a portion of the strained first semiconductor layer 120.

A thermal anneal, e.g., at 1100° C. for 1 second, is performed to re-crystallize the amorphized material in the gate electrode 165. Third semiconductor material 190 is re-grown in the recesses 185, 185'. A CMOS process may be completed by metallization and definition of contacts (not shown).

Figure 4A:
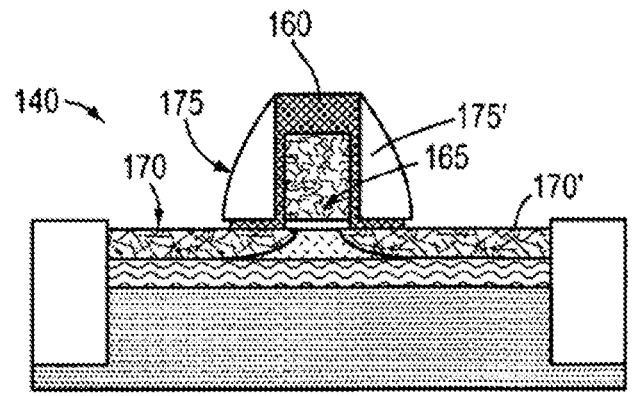
Figure 4B:
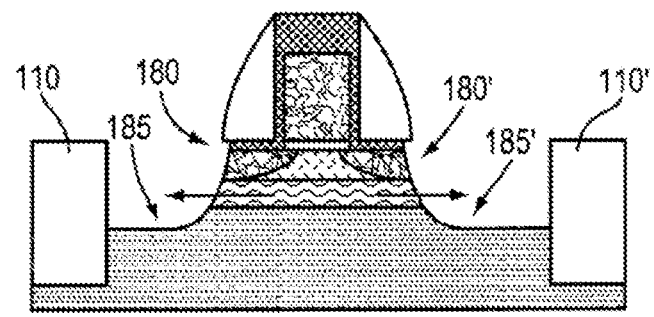
Figure 4C:
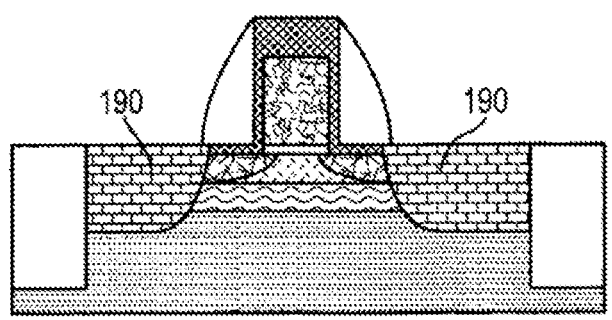
Figure 5A:
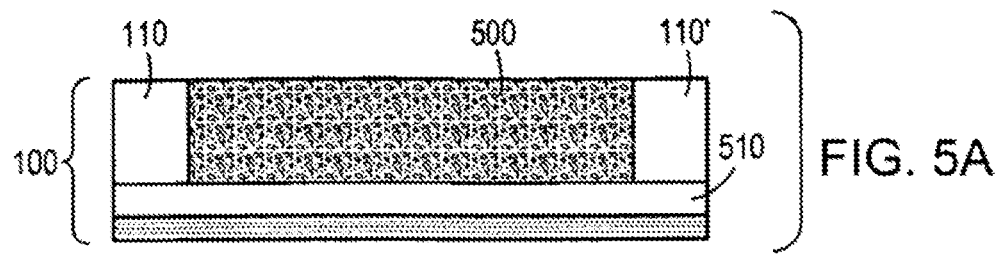
FIGS. 5a-5e are cross-sectional views illustrating the fabrication of the structure of FIGS. 1a-1e on a semiconductor-on-insulator (SOI) substrate or SSOI substrate.
Figure 5B:
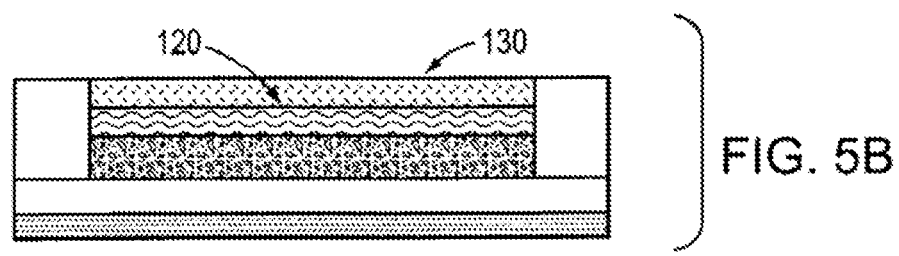
Figure 5C:
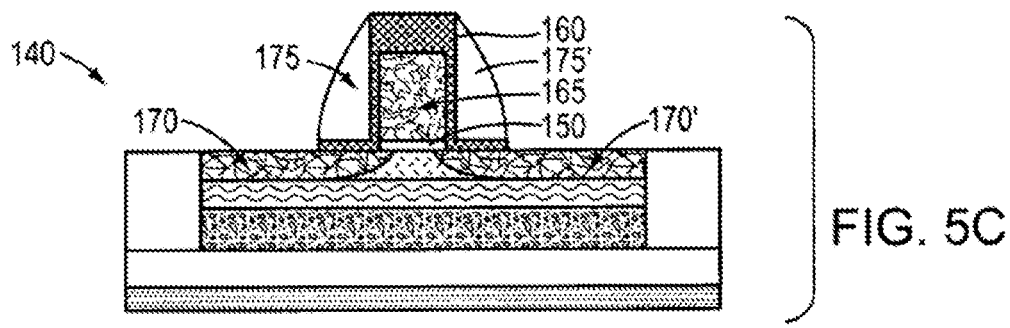
Figure 5D:
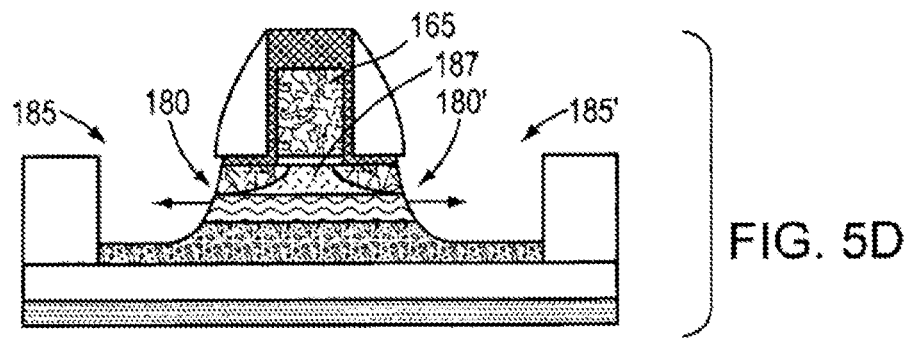
Figure 5E:
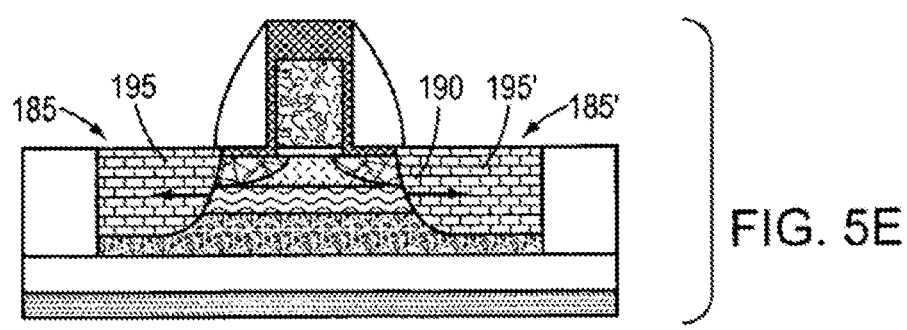
Figure 6A:
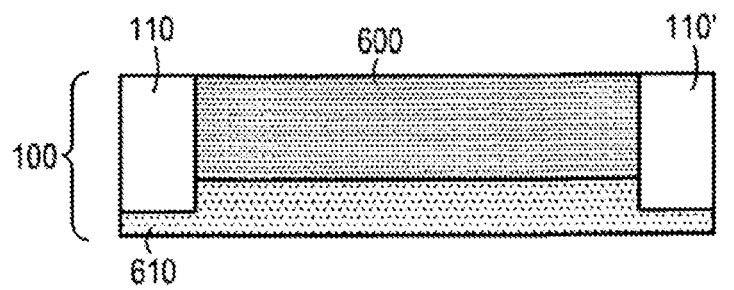
FIGS. 6a-6e are cross-sectional views illustrating the fabrication of the structure of FIGS. 1a-1e on a substrate including a strained layer disposed over a graded layer.
Figure 6B:
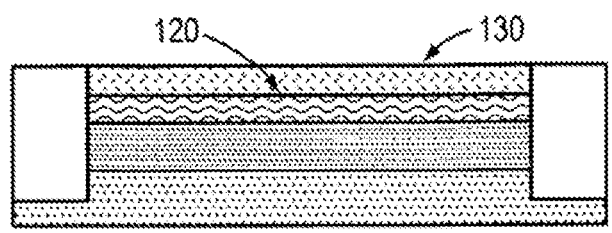
Figure 6C:
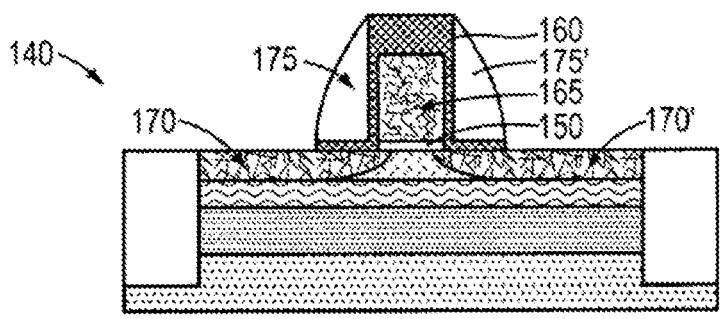
Figure 6D:
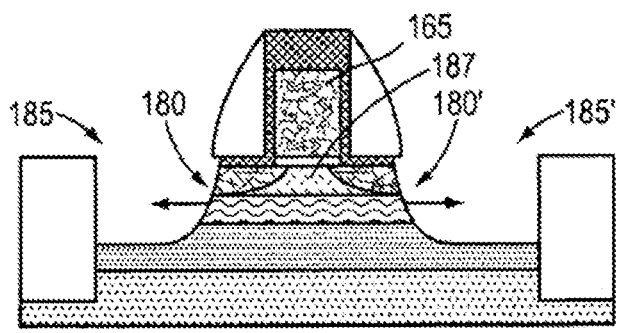
Figure 6E:
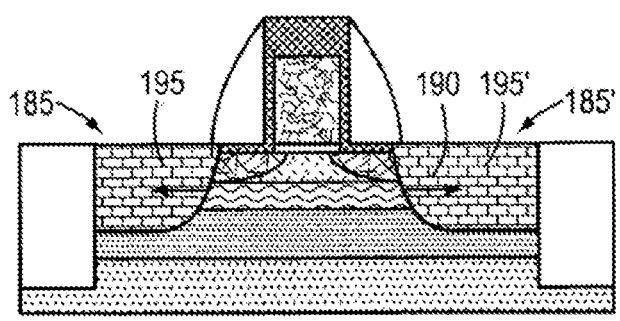

Referring to FIGS. 4a-4c, gate electrode 165, as deposited, may include an amorphous material, such as amorphous Si. The amorphous material may be deposited by low pressure chemical vapor deposition (LPCVD) or plasma enhanced chemical vapor deposition (PECVD). Alternatively a metal gate electrode may be used. The metal is preferably selected such that a material transformation takes place at the activation temperature to allow strain in the metal gate to be relaxed. In an embodiment, transistor 140 is processed through the processing point illustrated in FIG. 1c, i.e., through the fabrication of the gate electrode 165 and source and drain extension regions 170, 170', and including masking layer 160 over the gate electrode 165. Portions of the crystalline first and second semiconductor layers 120, 130 and substrate 100 disposed between the sidewall spacers 175, 175' and STI regions 110, 110' are removed to define recesses 185, 185' and lateral free surfaces 180, 180'. The recesses may be defined by, e.g., a reactive ion etch or a selective wet etch. The free surface 180, 180' is positioned to allow relaxation of at least a portion of the strained first semiconductor layer 120.

A thermal anneal, e.g., at 1100° C. for 1 second, is performed to crystallize the amorphous material in the gate electrode 165. Third semiconductor material 190 is re-grown in the recesses 185, 185'. A CMOS process may be completed by metallization and definition of contacts (not shown).

Referring to FIGS. 5a-5e, substrate 100 may be an SOI wafer, including a semiconductor layer 500, e.g., Si, disposed over an oxide layer 510, e.g., SiO$_2$. In some embodiments, the semiconductor layer 500 may be strained such that substrate 100 is an SSOI wafer. Transistor 140 may be formed as described above with respect to FIGS. 1a-1e on the SOI or SSOI wafer.

As shown in FIGS. 6a-6e, substrate 100 may include a strained layer 600 disposed over a graded buffer layer 610. Strained layer 600 may include tensilely strained Si, and the graded buffer layer 610 may include SiGe.

The stress inducement techniques described herein are especially effective when used with SSOI or strained silicon on a graded buffer for two reasons. First, SSOI and strained silicon on SiGe graded buffer are susceptible to stress relaxation after a source/drain implantation. The mechanism of stress relaxation is the opposite of the stress-inducement process described herein: the source/drain implantation creates a lateral free surface and relaxes the desired strain. The problem of stress relaxation becomes severe for short gate lengths. For very small gate lengths (<30 nm), a large portion of the stress at the surface of a MOSFET on an SSOI or a strained silicon wafer may be lost due to this phenomena. The strained buried layer described herein may be used to counteract the relaxation, and therefore make SSOI and strained silicon effective even for very short gate lengths.

The second reason that the strained buried layer technique is especially effective on SSOI or strained silicon on a SiGe graded buffer is that it may be possible to use a more highly strained buried layer than on an unstrained substrate. As shown in the simulations below, the strain induced in the second semiconductor layer increases in proportion to the strain in the first semiconductor layer. Therefore, it is desired that the first semiconductor layer have a high level of strain.

However, the strain level of the first semiconductor layer may be limited by the creation of dislocations. If the strain in the first semiconductor layer is too large, dislocations may be created that may cause leakage in a MOSFET which is subsequently formed. The strain energy in the first semiconductor layer is proportional to the square of the difference between the lattice constant of the substrate and natural lattice constant of the first semiconductor layer. Therefore, using a strained substrate layer (i.e., SSOI or strained silicon on SiGe graded buffer) may allow the first semiconductor layer to have more strain without generating dislocations.

For example, if the substrate material is silicon and the first semiconductor is SiGe with a germanium percentage of 25%, then the natural lattice constant of the first semiconductor layer is about 1% larger than the substrate lattice constant. Dislocations may be formed for a given thickness of the first semiconductor layer, and these dislocations may cause leakage in a MOSFET. In another case, the substrate is SSOI, the silicon is tensilely strained, and its lattice constant is about 0.5% greater than that of silicon, and the same SiGe film is used as the first semiconductor layer. In the latter case, the difference between the lattice constant of the substrate material and the natural lattice constant of the first semiconductor layer is about 0.5%. Therefore the strain energy in the SiGe is lower, and dislocations may not form. This thickness and strain of the first semiconductor layer may be usable on SSOI because substantially no dislocations are formed, whereas it may not be useable on silicon because of the formation of dislocations.

Figure 7A:
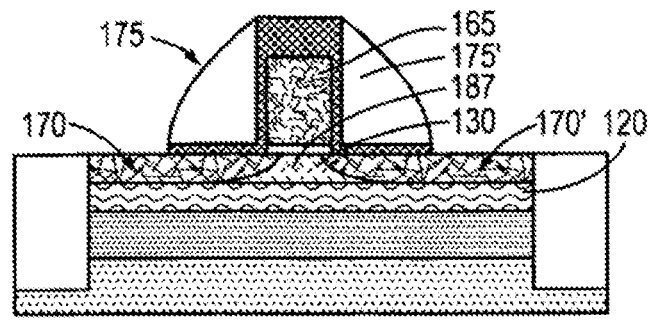
FIGS. 7a-7c are cross-sectional views illustrating the fabrication of a structure with sidewall spacers engineered for inducing stress.
Figure 7B:
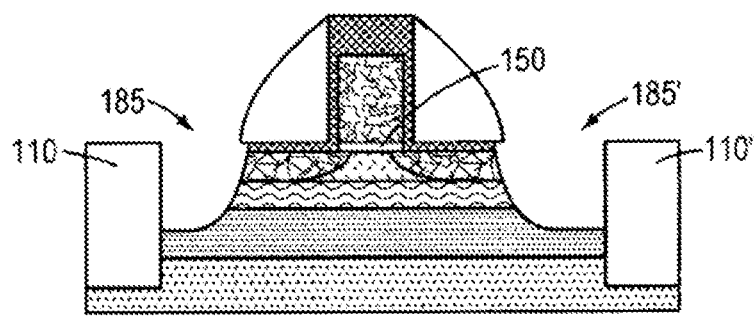
Figure 7C:
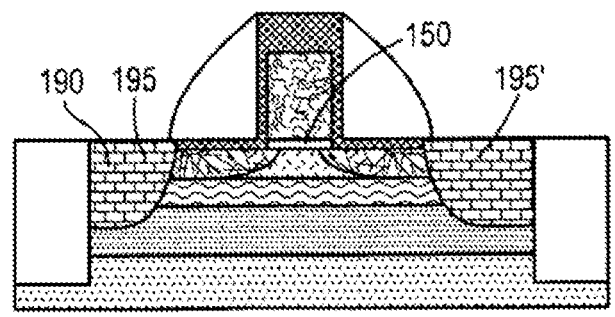
Figure 9A:
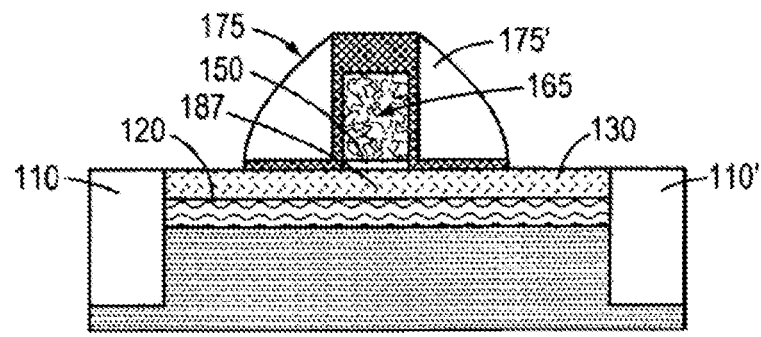
FIGS. 9a-9e are cross-sectional views illustrating the fabrication of a structure with sidewall spacers engineered for increasing stress and subsequent removal and replacement of the sidewall spacers.
Figure 9B:
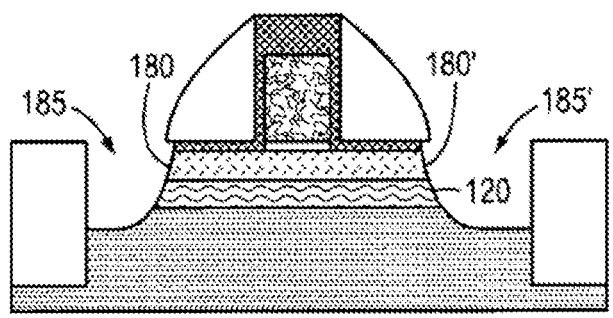
Figure 9C:
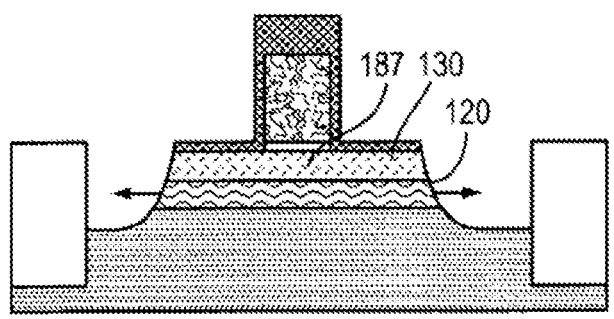
Figure 9D:
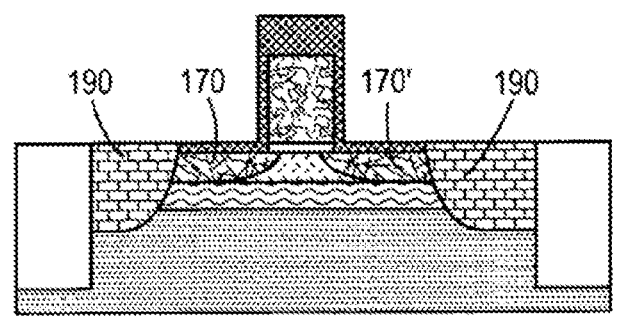
Figure 9E:
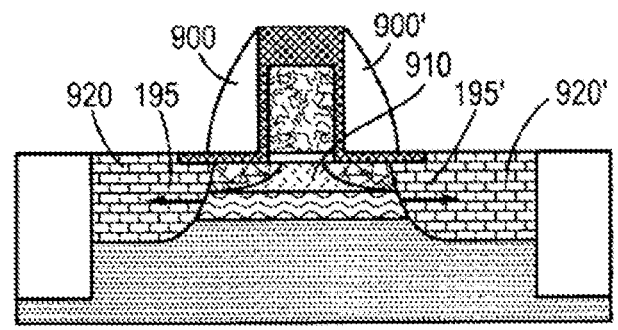
Figure 10A:
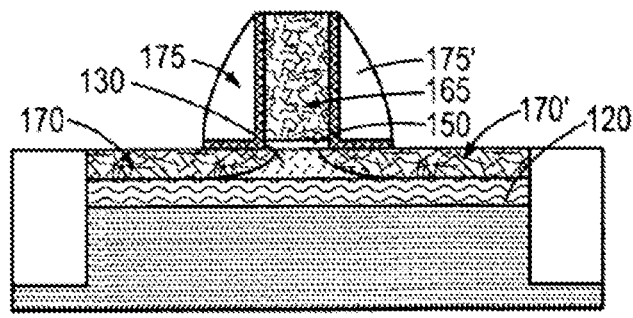
FIGS. 10a-10e are cross-sectional views illustrating the fabrication of a structure using stress memorization and removal of sidewall spacers to increase the stress.
Figure 10B:
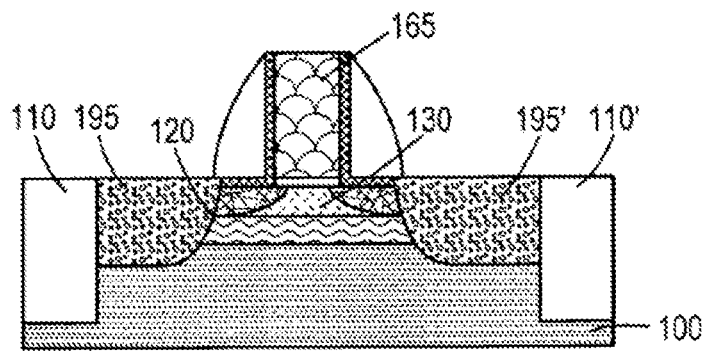
Figure 10C:
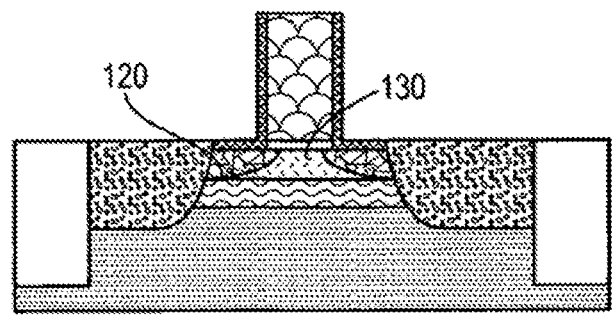
Figure 10D:
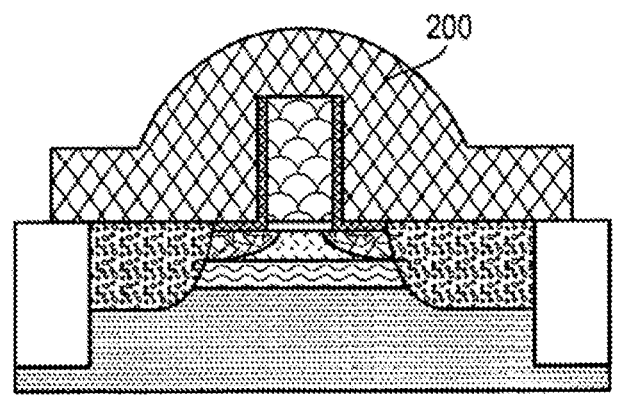
Figure 10E:
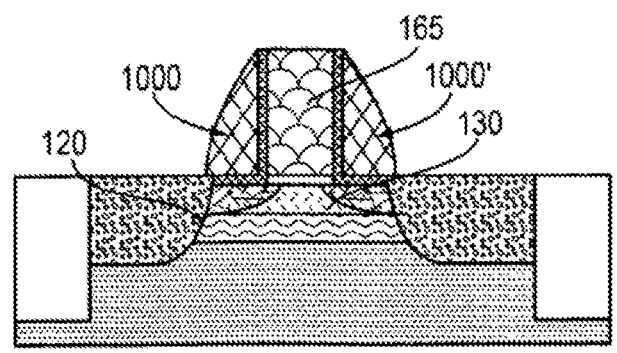

Referring to FIGS. 7a-7c, sidewall spacers 175, 175' may be engineered to induce a desired level of strain in second semiconductor layer 130 and the channel 187. The process illustrated in FIGS. 1a-1e may be carried out with relatively wide sidewall spacers 175, 175'. A wide spacer may usefully allow a large amount of stress to be transferred to the second semiconductor layer even for very short gate lengths. For gate lengths that are very short, e.g., about 18 nm and with a standard spacer width, e.g., about 20 nm, the total width of the first semiconductor layer (gate length plus twice the spacer width) may be too small to transfer a large amount of stress to the semiconductor layer. Using a wider spacer results in a large total width of the first semiconductor layer, even with a very short gate length. However, the use of a wide spacer may be disadvantageous because of the high electrical resistance beneath the spacer from the channel to the deep source drain. Therefore, it may be useful to use the wide spacer as a sacrificial spacer, and remove it after etching, and then replace it with a device sidewall spacer (see, e.g., process flow discussed below with reference to FIGS. 9a-9b).

A typical width of the wide spacer is about 15-100 nm, and a typical width of the standard spacer is 10-30 nm. If the gate length is 12 nm, a typical spacer width may be about 10 nm. However, the total width of the first semiconductor layer after the recess formation may be only 32 nm. Using a wide spacer of about 18 nm instead of 10 nm may increase the total width of the first semiconductor layer to 48 nm, and may increase the amount of strain induced in the second semiconductor layer beneath the gate.

Figure 8A:
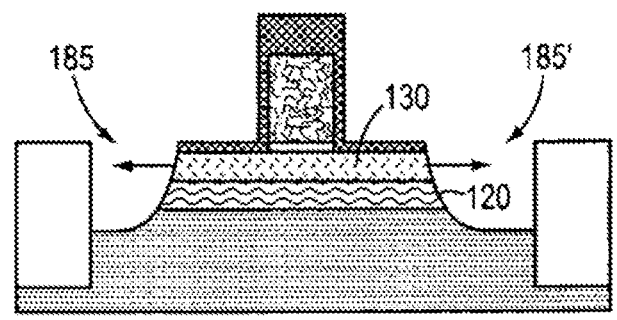
FIGS. 8a-8c are cross-sectional views illustrating the fabrication of a structure, including removal of sidewall spacers to increase the stress.
Figure 8B:
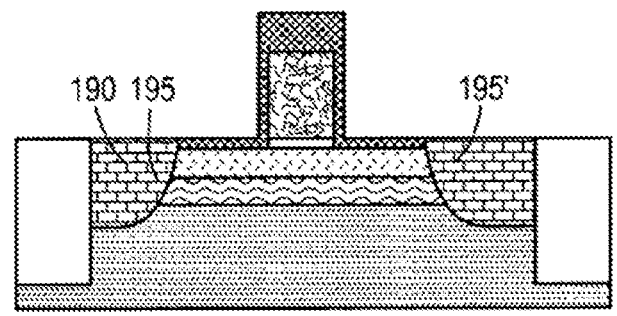
Figure 8C:
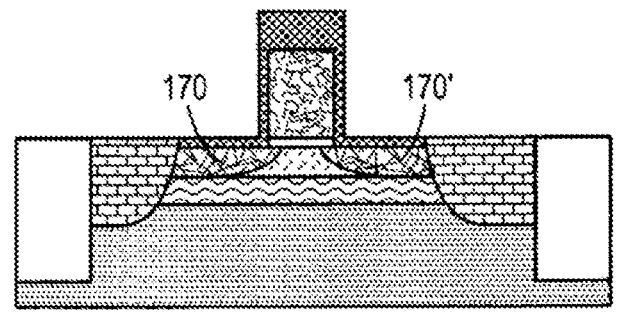

Referring to FIGS. 8a-8c as well as FIG. 1d, after the formation of the recesses 185, 185' but without the definition of the source and drain extension regions 170, 170', sidewall spacers 175, 175' may be removed by, e.g., a wet etch, to allow the first semiconductor layer 120 to relax further and thereby induce additional strain in at least a portion of the second semiconductor layer 130.

Third semiconductor material 190 is re-grown in the recesses 185, 185', and source and drain regions 195, 195' defined. Shallow source and drain extension regions 170, 170' may be implanted, preferably after the sidewall spacers 175, 175' are removed, so that dopants introduced during the extension implant do not diffuse during the spacer deposition and third semiconductor material re-growth processes. A CMOS process may be completed by metallization and definition of contacts (not shown).

Referring to FIGS. 9a-9e, sidewall spacers 175, 175' engineered to induce a desired level of stress in second semiconductor layer 130 and the channel 187 may be used as sacrificial spacers and removed and replaced with device sidewall spacers having an appropriate width for the particular technology node, as listed in the *International Technology Roadmap for Semiconductors* 2005 (hereinafter "ITRS 2005"). STI regions 110, 110' and first and second semiconductor layers 120, 130 are defined as discussed above with reference to FIGS. 1a-1b. Transistor 140 is formed, including gate dielectric layer 150 and gate electrode 165. Sidewall spacers 175, 175' (formed from, e.g., silicon dioxide disposed over silicon nitride) are defined proximate the gate electrode 165. As discussed above with reference to FIGS. 8a-8c, sidewall spacers 175, 175' may have relatively large widths to induce additional strain in the underlying channel 187.

After the definition of the sidewall spacers 175, 175', portions of the crystalline first and second semiconductor layers 120, 130 and substrate 100 disposed between the sidewall spacers 175, 175' as well as STI regions 110, 110', are removed to define recesses 185, 185' and free surfaces 180, 180'. The free surfaces 180, 180' are configured to allow relaxation of at least a portion of the strained first semiconductor layer 120.

The sidewall spacers 175, 175' are removed to allow further expansion of first semiconductor layer 120, thereby inducing additional strain in the second semiconductor layer 130, including in the channel 187. Third semiconductor material 190 may be deposited in the recesses 185, 185'. Shallow source and drain extension regions 170, 170' are then implanted.

After the implantation of the shallow source and drain extension regions 170, 170', replacement device sidewall spacers 900, 900' may be defined. Replacement device sidewall spacers 900, 900' may be formed in accordance with ITRS guidelines. For example, for the 45 nm technology node, replacement device sidewall spacers 900, 900' may have a width of 20 nm. Source and drain regions 195, 195' may be formed by a deep source/drain ion implantation, and an activation anneal may be performed. A CMOS process may be completed by metallization and definition of contacts (not shown).

In the resulting structure, a first region 910 is disposed under the gate electrode and replacement device sidewall spacers 900, 900'. A second region 920, 920' extends into the first and second semiconductor layers and fills the volume that was used to create the lateral free surface. The second region is disposed laterally and spaced apart from the outside edge of the replacement device sidewall spacer and from the first region. This second region includes a third material that may consist of the same material as the first semiconductor layer and/or the second semiconductor layer. Alternatively, it may be an amorphized region of the first and second semiconductor layers. In yet another embodiment, the third material may have a composition different from the first and second layers, e.g., the first layer may include silicon germanium, the second layer may include silicon, and the third material may be silicon carbide. The composition and/or defect density of the second region may be different from a composition and/or defect density of the first region.

Referring to FIGS. 10a-10e, a process may combine stress memorization and sidewall spacer removal. Gate electrode 165 and gate dielectric layer 150 are defined over first and second semiconductor layers 120, 130, between STI regions 110, 110'. A shallow (less than 10 nm) extension implant is performed to define shallow source and drain extension regions 170, 170'. Sidewall spacers 175, 175' are defined proximate the gate electrode 165.

An amorphization implant is performed to amorphize crystalline material in the gate electrode 165, and in portions of the crystalline first and second semiconductor layers 120, 130 and substrate 100 that are disposed between the sidewall spacers 175, 175' and STI regions 110, 110'. Typical parameters for an appropriate amorphization implant may be, for example, a germanium implant with an energy of 20 keV and a dose of $1\times10^{15}/cm^2$. A deep source/drain implant is performed to dope the source and drain regions 195, 195' adjacent to the sidewall spacers. The depth of the deep source/drain is typically about 90 nm, the species is typically arsenic and/or phosphorous for an NMOSFET, and boron for a PMOSFET, and the peak dopant concentration typically exceeds $1\times10^{20}/cm^3$ for low sheet resistance and contact resistance.

Sidewall spacers 175, 175' are removed by, e.g., a wet etch to allow the first semiconductor layer 120 to more fully relax, increasing the stress in the second semiconductor layer 130.

Additional strain may be induced by stress memorization, in which case strain-inducing layer 200 is deposited over the transistor 140. For example, the strain-inducing layer 200 may include $Si_3N_4$ and the gate dielectric 150 may include $SiO_2$. The strain-inducing layer may be stress-free, or it may have compressive or tensile stress, since both the initial film stress as well as the thermal expansion coefficient mismatch between the strain-inducing layer 200 and substrate 100 affect strain transfer. A thermal anneal is then performed to re-crystallize the gate, source, and drain, thus activating the dopants and creating a free surface adjacent to the channel in the source and drain and above the channel in the gate. A typical thermal anneal may be 1100° C. for 1 second. Strain is transferred both to the channel and to the gate from both the underlying strained layer and the overlying strained layer.

The strain-inducing layer 200 is etched to create sidewall spacers 1000, 1000'. Much of the strain remains in the second semiconductor layer 130, both because of the presence of the underlying first semiconductor layer 120, and because strain has been transferred to the overlying gate electrode 165. The CMOS process is then completed, including the deposition of dielectric insulating layers and metal interconnects (not shown).

Figure 11A:
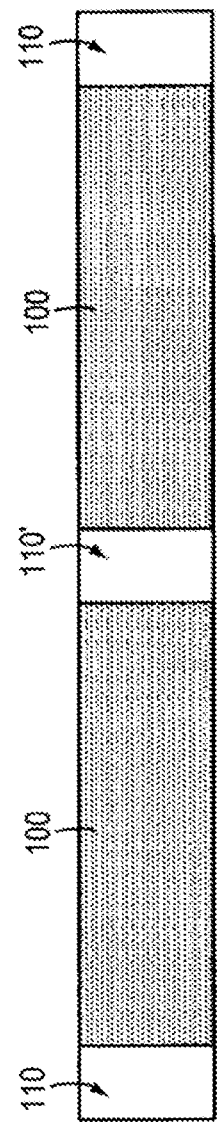
Figure 11B:
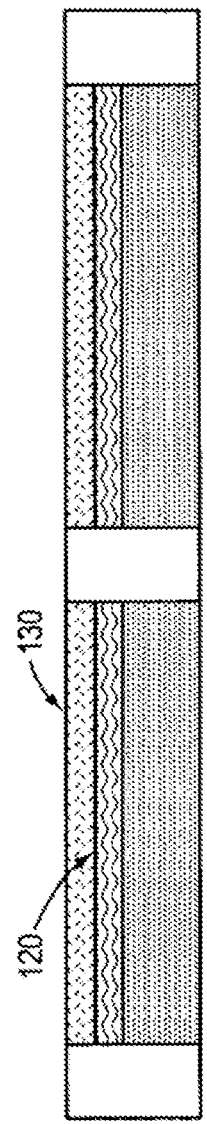
Figure 11C:
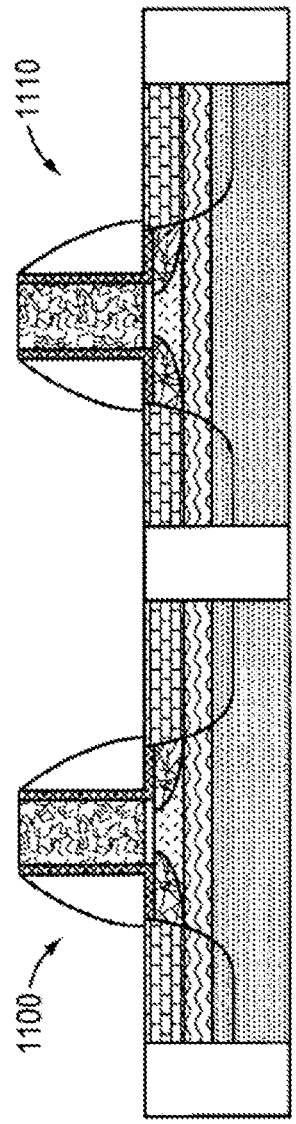

The strain-inducing processes described above may be combined with a buried strained layer device on the same substrate. A strained surface layer device may be an NMOSFET and a buried strained layer device may be a PMOSFET. The buried layer may include a SiGe alloy. PMOSFETs with a buried SiGe layer are known to have high carrier mobilities; therefore, this combination enables the formation of both an enhanced NMOSFET and an enhanced PMOSFET on the same substrate. The combined process is illustrated in FIGS. 11a-11e. A substrate 100 is processed up to and including STI 110, 110' formation (FIG. 11a). The first strained semiconductor layer 120 is selectively grown on exposed semiconductor areas and a second semiconductor layer 130 is grown on the first semiconductor layer (FIG. 11b). Both an NMOS and a PMOS device 1100, 1110 are formed, as illustrated in FIG. 11c (intermediate steps such as masking, etching, and implantation of source and drain regions not shown). Referring to FIG. 11d, a mask layer 1120 is formed and patterned to expose an active area, e.g., the NMOS device 1100. The recesses 185, 185' are defined in the exposed NMOS device, causing the first semiconductor layer 120 to relax, and inducing strain in the second semiconductor layer 130 only in the exposed device. Referring to FIG. 11e, the third semiconductor material 190 is re-grown in the source/drain regions of the exposed device and the masking layer 1120 is removed. The CMOS process is then completed, including the deposition of dielectric insulating layers and metal interconnects (not shown).

Figure 12A:
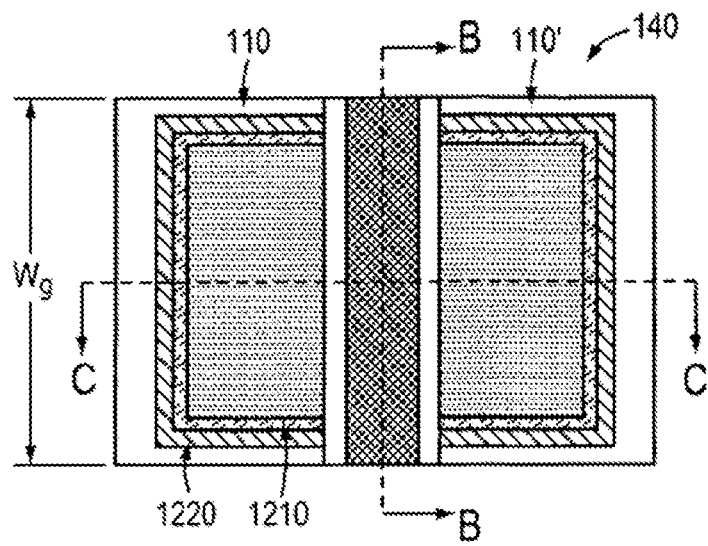
FIGS. 12a-12l and 13a-13c are cross-sectional and top views illustrating a fabrication process including reduction of STI regions.
Figure 12B:
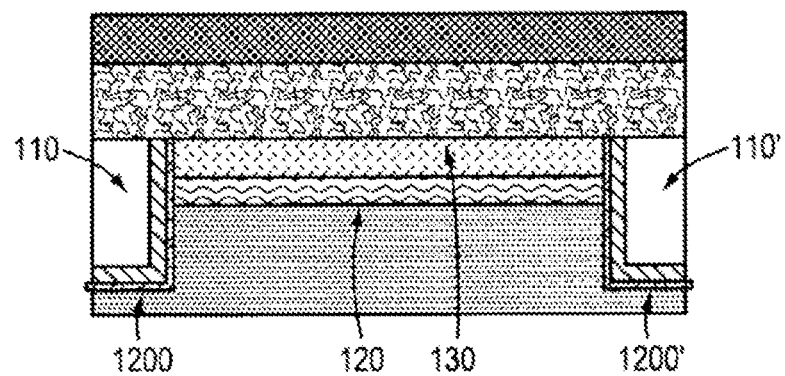
Figure 12C:
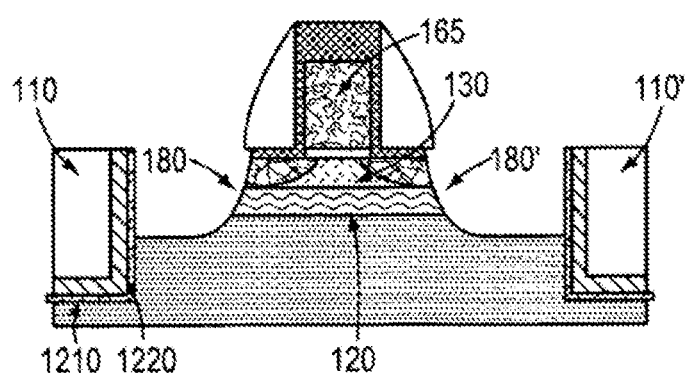

The local-stress technique described above, in which the relaxation of a buried layer is used to induce strain in a MOSFET channel, may not work well for narrow MOSFET gate widths, i.e., gate widths<1 micrometer (µm). Referring to FIG. 12a-12c, a transistor 140 having a narrow gate width is depicted directly after a source/drain etch created the lateral free surface 180, 180' as described above with reference to FIG. 1d. FIG. 12a is a plan-view of transistor 140, FIG. 12b depicts the side view of a cut parallel with the gate width $w_g$, and FIG. 12c is the side view of a cut perpendicular to the gate width $w_g$.

The relaxation of the first semiconductor layer 120, e.g., a buried SiGe layer, may be resisted by the STI regions 110, 110'. Therefore, the strain in the silicon channel 130 may be lower in portions of the channel closer to the STI region 110, 110' in comparison to portions of the channel further from STI edges 1200, 1200'. This prevention of relaxation may affect the stress in narrow devices more significantly than in wide devices because the proportion of the device channel that is close to the STI edge 1200, 1200' is greater in narrow devices than in wide devices.

The reduced relaxation of the first semiconductor layer 120 may be mitigated by removing portions of the STI regions 110, 110' that may restrict the expansion of the first semiconductor layer 120. The approach may be used in any of the fabrication processes described above; it is described here with respect to the fabrication process illustrated in FIGS. 1a-1f.

The transistor 140 fabrication process is executed through the step illustrated in FIG. 1d. Silicon nitride sidewall spacers, 170, 170' are used. In an embodiment, the STI regions 110, 110' are made, e.g., with a silicon dioxide liner 1210 and silicon nitride liner 1220. Silicon dioxide/silicon nitride liners are commonly used in the industry to reduce stress related dislocations in silicon near STI edges. The liner layers are typically thin, e.g., <10 nm.

Figure 12D:
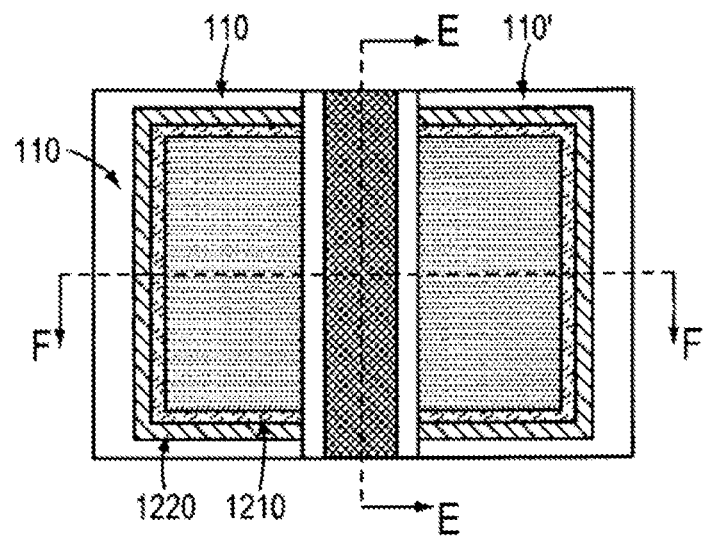
Figure 12E:
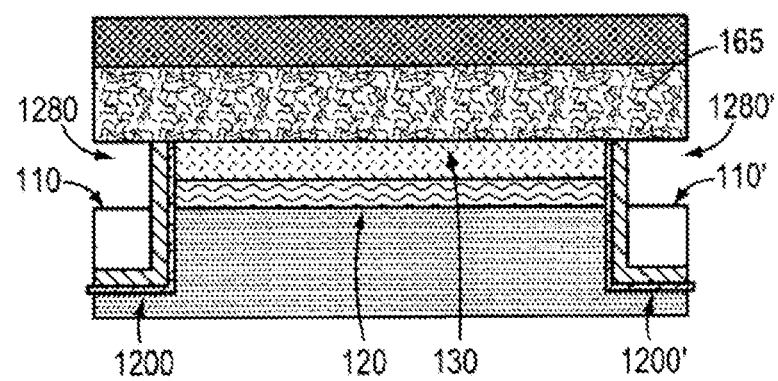
Figure 12F:
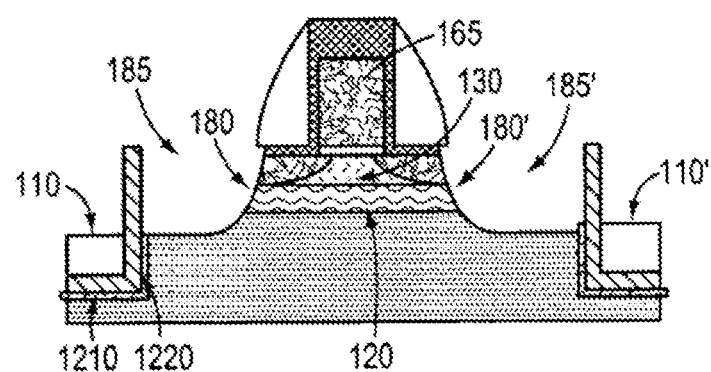

Referring to FIGS. 12d-12f, portions of the STI regions 110, 110' are removed so that the first semiconductor layer 120 is allowed to relax. Removal of portions of the STI regions 110, 110' creates a second free surface 1280, 1280' under the gate electrode 165 portion disposed over STI regions 110, 110', in addition to the first free surface 180, 180' created by removing portions of the first and second semiconductor layers 120, 130. The STI portions may be removed by an etch, e.g., a wet etch, such as with hydrofluoric acid, or reactive ion etch, both of which can etch silicon dioxide at a much faster rate than silicon nitride. The spacer regions 170, 170' and the nitride liner 1220 are etched insignificantly because of the etch rate selectivity of silicon nitride to silicon dioxide. The narrow width transistor 140 shown in FIGS. 12d-12f preferably has a strain similar to that of a wide device because the STI regions 110, 110' no longer restrict the expansion of the first semiconductor layer 120. The silicon dioxide liner 1210 and silicon nitride liner 1220 layers remain after the STI etch and, therefore, may still restrict the expansion of the first semiconductor layer 120. However, the liner layers 1210, 1220 are very thin and, therefore, may only slightly restrict the expansion of the first semiconductor layer 120.

Figure 12G:
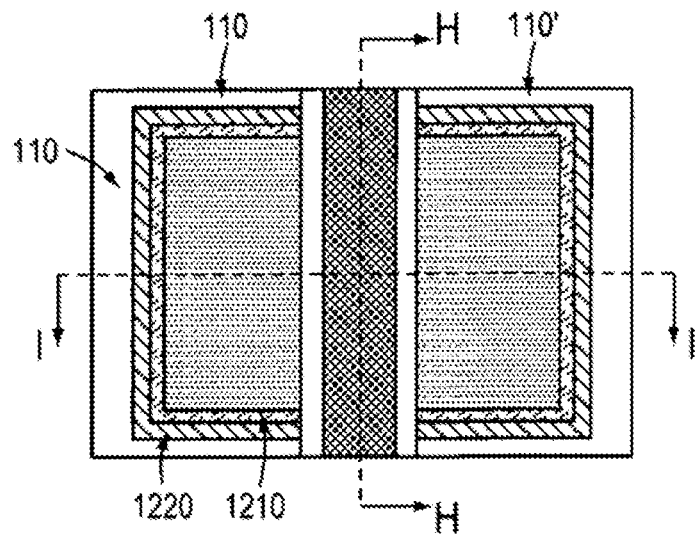
Figure 12H:
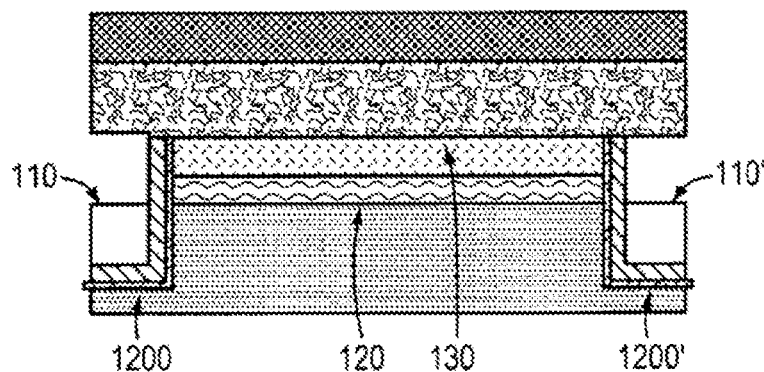
Figure 12I:
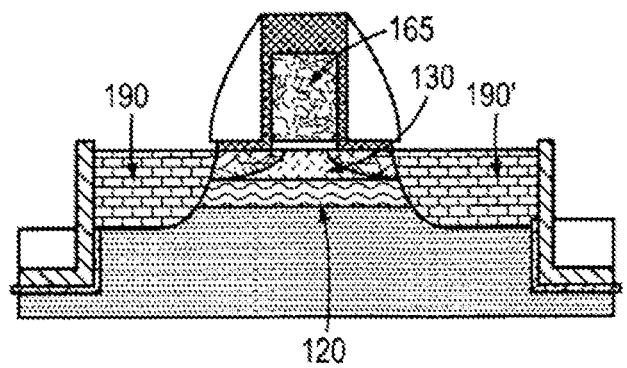

Referring to FIGS. 12g-12i, the fabrication process is continued as described above, including filling the etched source drain regions 185, 185' with a third semiconductor material 190, 190' and with dopant activation. The nitride layer protecting the gate electrode 165 is then stripped, and a metal-semiconductor alloy, e.g., silicide, is formed on the gate, source, and drain.

Figure 12J:
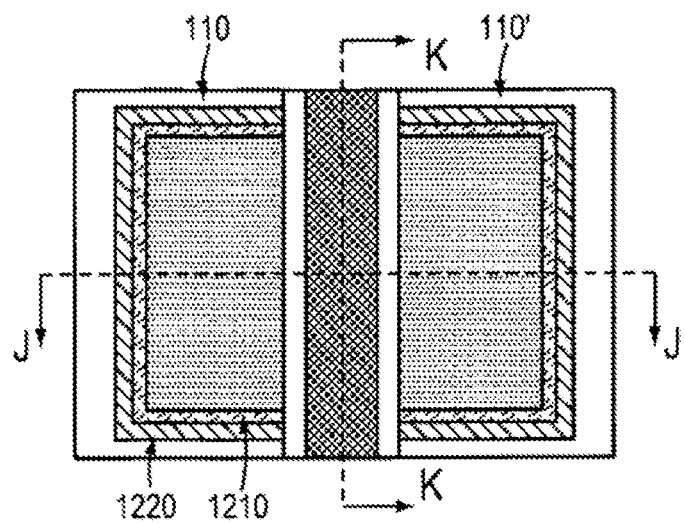
Figure 12K:
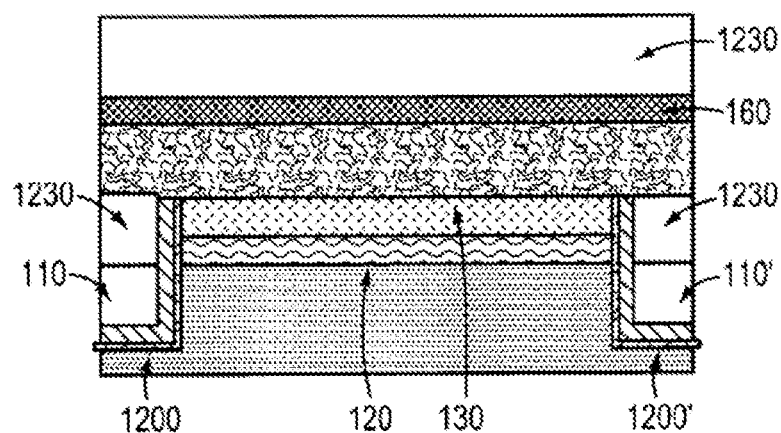
Figure 12L:
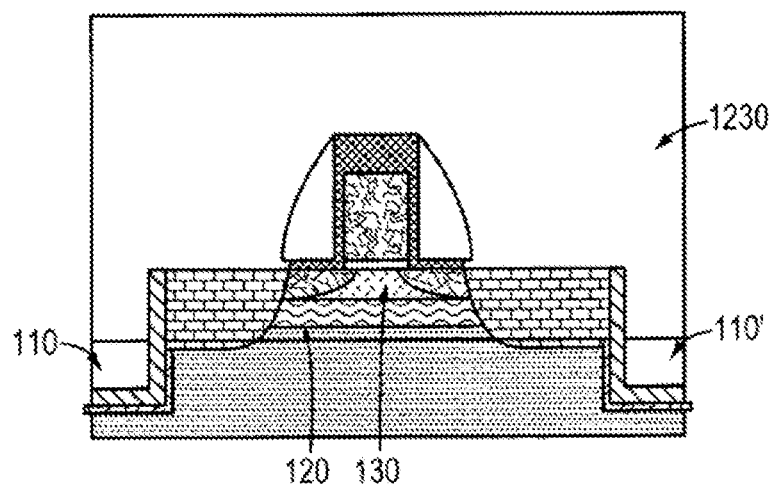

The STI regions 110, 110' that were etched are then re-filled with an inter-layer dielectric layer 1230, during the inter-layer dielectric deposition step, as shown in FIGS. 12j-12l. The CMOS fabrication process is then carried out to completion of packaged devices (not shown).

Figure 13A:
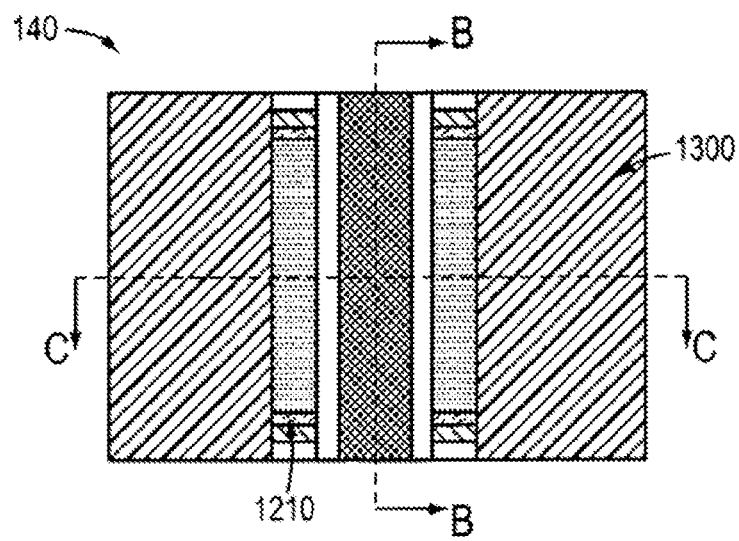
Figure 13B:
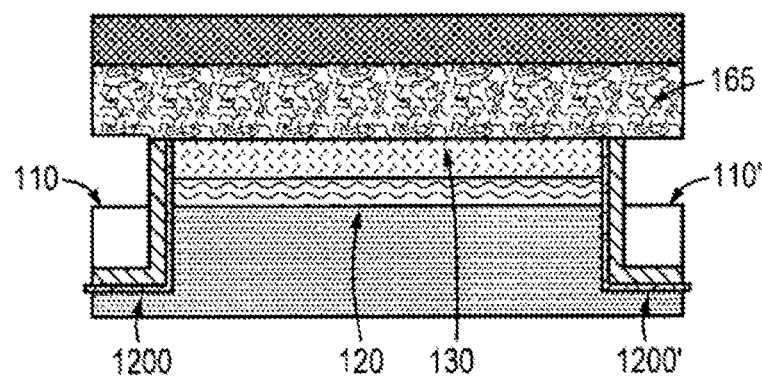
Figure 13C:
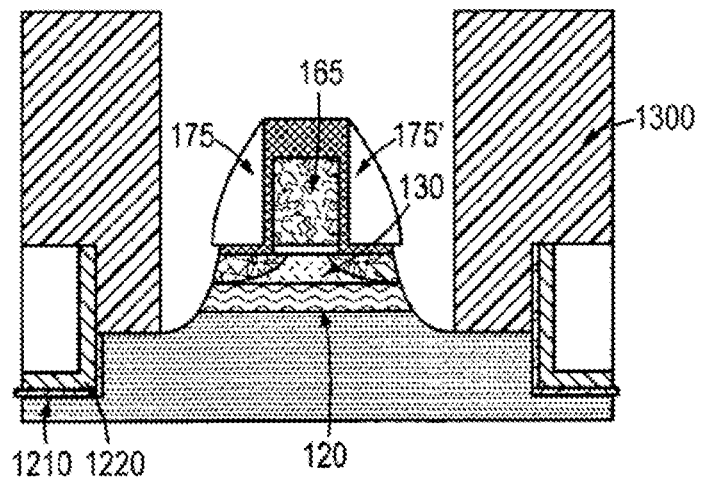

Referring to FIGS. 13a-13c, the process described with reference to FIGS. 12a-12l may be modified as follows. A fabrication process for forming a transistor 140 is performed until the structure illustrated in FIG. 12a is defined. A masking layer 1300, such as photoresist, is formed over the structure. The masking layer 1300 may be patterned using lithography to reveal an area above the gate electrode 165 and sidewall spacers 175, 175' and extending a small distance beyond the spacer edges. The structure is then etched, either using a wet etchant such as hydrofluoric acid or using an isotropic reactive ion etch. The portions of STI regions 110, 110' that are not masked are etched, including, e.g., portions underlying gate electrode 165. The masked regions of the STI regions 110, 110', on the other hand, are not removed. The device is shown in FIG. 13a-13c after the etch step. The masking layer is then stripped and the process is continued as described above, including source/drain re-growth and STI re-fill, and the CMOS fabrication process is performed to completion. The advantage of adding a masking step during the etchback of the portions of the STI regions 110, 110' proximate the free surfaces is that this process may reduce any source/drain to substrate leakage problems that may be caused by etching and re-filling the entire STI regions.

Stress Simulations

Stress simulations of the buried layer stress technique were carried out using the TSUPREM4 finite element analysis program. This program calculates the stress in a structure given an initial stress and the fabrication process steps. Stress contours were simulated in a SiGe layer and an overlying silicon layer for a simulated 22 nm node device with $L_g$=13 nm, $t_{spacer}$=14 nm, $t_{Si}$=4 nm, $t_{SiGe}$=16 nm, $t_{etch}$=50 nm, and $\sigma_{xx\_SiGe}$=−2.6 GPa (where $\sigma_{xx\_SiGe}$ is the in-plane stress in the SiGe film prior to source/drain recess etch). The structure of the device is illustrated in FIG. 1d. Only the right half of the device was simulated because the structure is symmetric and simulation of the entire device would be redundant. For this example, the average stress under the gate at the gate oxide/silicon interface was 1.13 GPa, or 43% of the magnitude of the stress in the as-grown SiGe film prior to etch.

Stress simulations were conducted with various dimensions of $t_{Si}$, $t_{SiGe}$, $t_{etch}$, and $\sigma_{xx\_SiGe}$, and the average stress at the gate oxide/silicon interface ($\sigma_{xx\_SiAvg}$) was recorded for each case. Two initial conclusions were drawn from these simulations: 1) $\sigma_{SiAvg}$ is insensitive to $t_{etch}$ as long as $t_{etch}$ is significantly greater than $t_{Si}+t_{SiGe}$, and 2) $\sigma_{SiAvg}$ is a linear function of $\sigma_{xx\_SiGe}$ (i.e., if $\sigma_{xx\_SiGe}$ increases by a factor, then $\sigma_{xx\_SiAvg}$ increases by the same factor). With this understanding, further simulations were conducted to determine the effectiveness of the buried stress layer for ITRS technology nodes from the 65 nm node ($L_g=32$ nm) to the 12 nm ($L_g=10$ nm) node. For each node, the gate length and spacer thickness ($t_{spac}$) were set according to the 2005 ITRS road-map. See ITRS 2005, page 23. In these simulations, $t_{Si}$ was varied between 1 and 12 nm and $t_{SiGe}$ between 2 and 20 nm. $t_{etch}$ was kept constant at 50 nm and $\sigma_{xx\_SiGe}$ was kept constant at −2.6 GPa.

Figure 14:
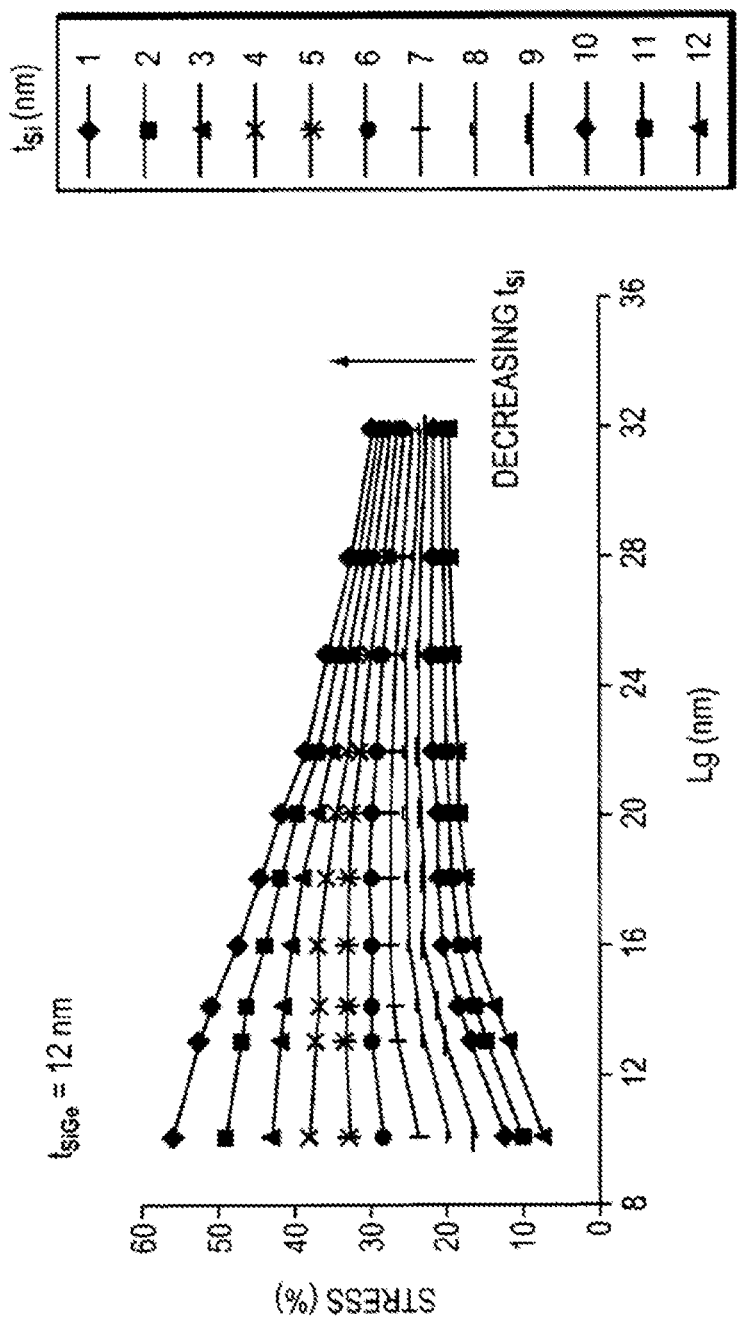
FIGS. 14-16 are graphs summarizing simulation results.
Figure 15:
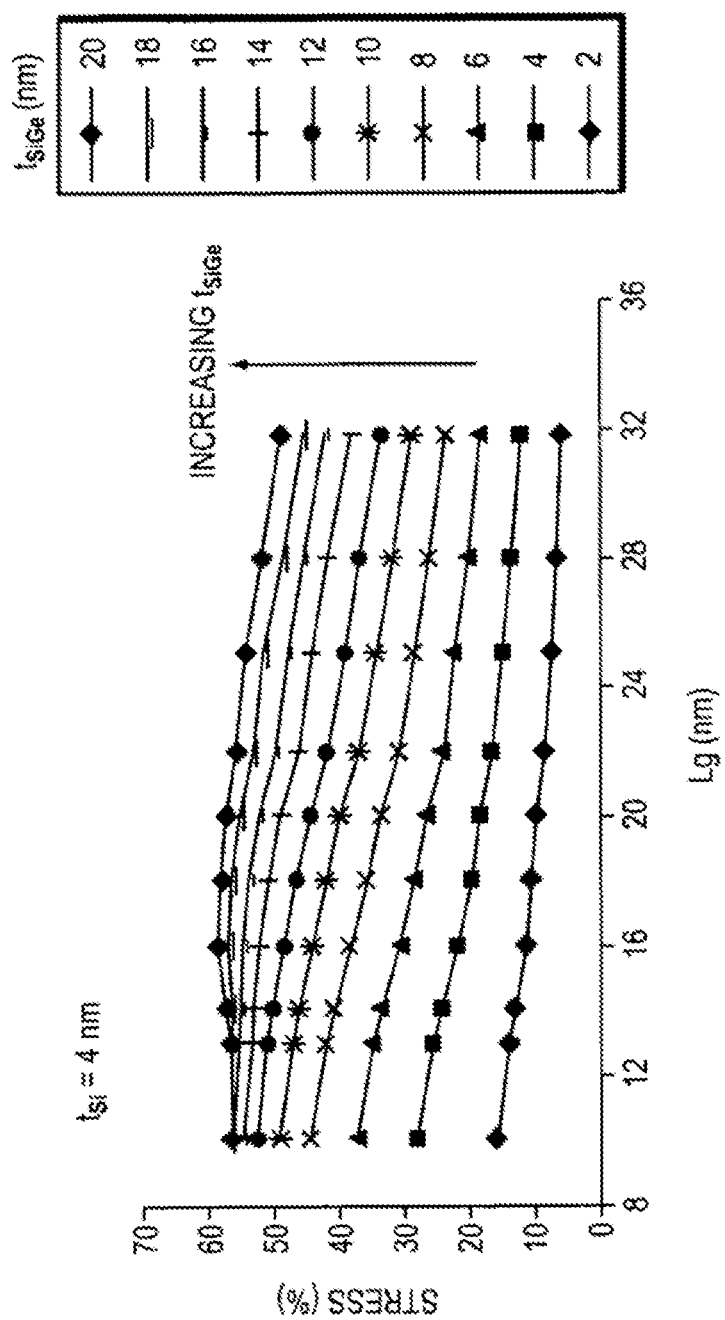

A summary of the simulation results is shown in FIGS. 14 and 15. These figures show the average channel stress relative to the SiGe stress prior to etch ($abs(\sigma_{xx\_SiAvg}/\sigma_{xx\_SiGe})$) as a function of the gate length. FIG. 14 shows the relative average stress for different $t_{Si}$ for $t_{SiGe}=12$ nm. This plot shows that for a thin silicon layer, the average tensile strain transferred to the surface of the silicon layer increases as the gate length is reduced. However, the technique becomes less effective for thicker silicon layers. The transferred stress is reduced for thicker layers for all gate lengths, and it is reduced most greatly for short gate lengths.

FIG. 15 explores the effect of the buried SiGe layer thickness. This figure shows the relative average stress at the silicon surface as a function of gate length for different values of $t_{SiGe}$ and a $t_{Si}$ of 4 nm. The average stress increases with increasing $t_{SiGe}$ for all values of $L_g$. However, increasing $t_{SiGe}$ is not effective at increasing stress in the silicon film for a thick $t_{SiGe}$ at a short $L_g$. This figure demonstrates that increasing the SiGe thickness improves the effectiveness of the technique, but that it is not useful to exceed a $t_{SiGe}$ of about 16 nm if the gate length of interest is less than about 16 nm.

The simulation study showed that a thin silicon layer and a thick underlying SiGe layer are preferable for increasing tensile stress transfer into the silicon film. However, the simulations were done without regard for the practical limits of these layers. Previous work on MOSFETs built on biaxial strained silicon on a SiGe graded buffer layer has shown that a minimum silicon thickness is determined by Ge diffusion from the underlying SiGe layer. A silicon thickness of at least 4 nm is preferred for avoiding degradation of the channel mobility. The limit of the thickness of the SiGe is determined by dislocation formation in the SiGe. The compressed buried layer structure is particularly sensitive to dislocations in the SiGe layer since this layer extends between the source and drain, and dislocations in this position are known to form an electrical short due to enhanced dopant diffusion along the dislocation. The exact SiGe thickness limit to avoid the formation of dislocations is, however, unclear. A lower bound estimate is the equilibrium critical thickness, $t_{crit}$. But this limit may be far too conservative, as it is well known that meta-stable films may be grown to several times the equilibrium critical thickness without dislocation formation if the growth temperature is low enough. Therefore, it may be possible to grow the SiGe layer several times the critical thickness while still avoiding the formation of dislocations.

Figure 16:
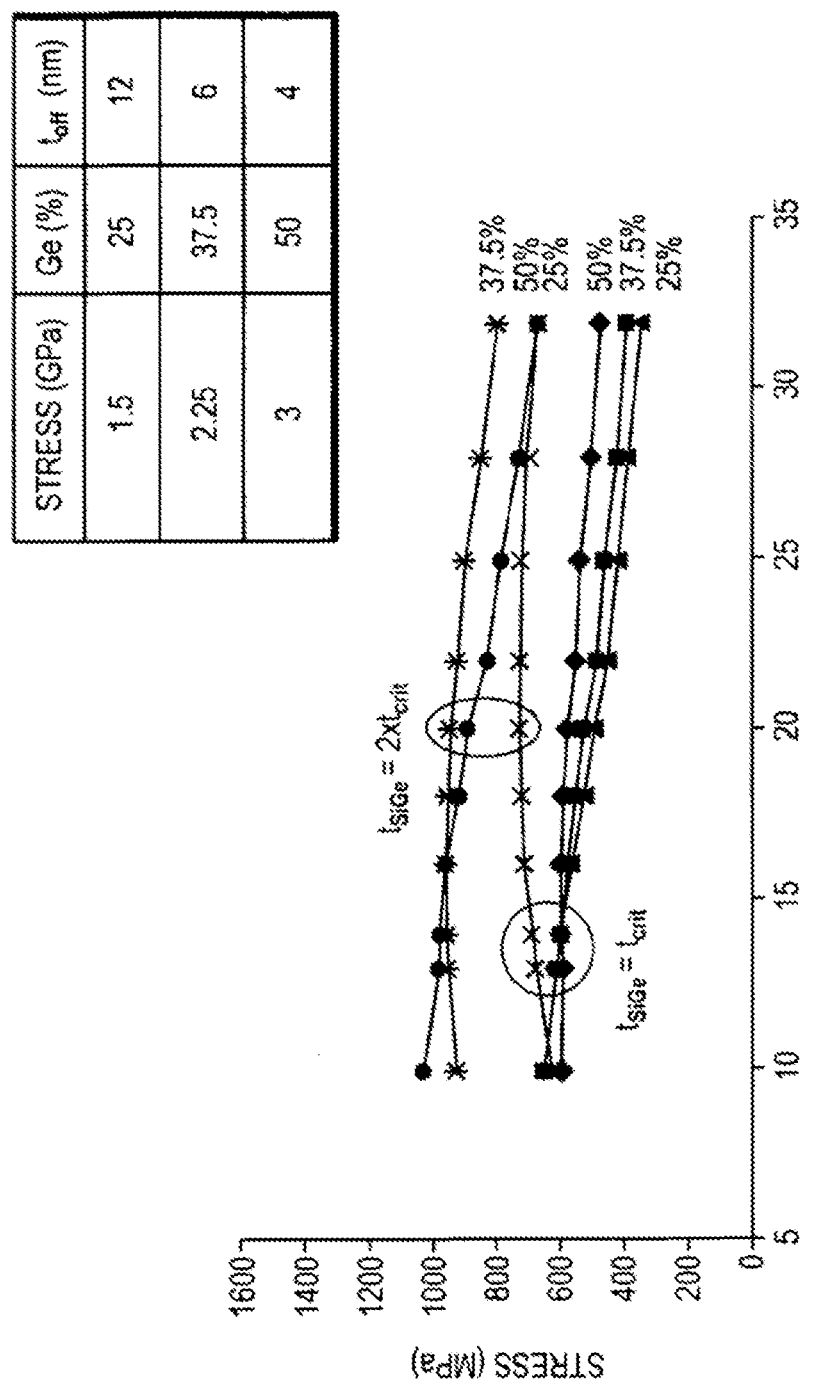

FIG. 16 demonstrates the effectiveness of the strained buried layer technique using practical limits to $t_{Si}$ and $t_{SiGe}$. Using specific data from FIG. 15, this figure shows the average stress level at the surface of the silicon as a function of $L_g$ for $t_{Si}=4$ nm and several different levels of the magnitude of stress $\sigma_{xx\_SiGe}$. For each level of stress $t_{SiGe}$ is set to two values, $t_{SiGe}=t_{crit}$ and $t_{SiGe}=2\times t_{crit}$, where $t_{crit}$ is the equilibrium critical thickness of SiGe on Si. A table inset in the plot shows the magnitude of $\sigma_{xx\_SiGe}$, the corresponding Ge % in the SiGe film, and the critical thickness for the data that was used. As can be seen, high levels of tensile stress exceeding 1 GPa may be achieved using this technique for useable values of $\sigma_{xx\_SiGe}$, $t_{SiGe}$ and $t_{Si}$.

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A method for forming a structure, the method comprising:
    forming a first crystalline semiconductor layer over a substrate, the first crystalline semiconductor layer being strained and having a first lattice constant;
    forming a second crystalline semiconductor layer on a top surface of the first crystalline semiconductor layer, the second crystalline semiconductor layer being relaxed and having a lattice constant different from the first lattice constant;
    forming a transistor including a gate electrode disposed above the second crystalline semiconductor layer, a sidewall spacer adjacent the gate electrode, and a channel region disposed below the gate electrode and at least partially in the second crystalline semiconductor layer; and
    creating a free surface above the channel region in at least one of the gate electrode or the sidewall spacer, wherein the free surface induces strain in at least a portion of the channel region disposed in the second crystalline semiconductor layer.

2. The method of claim 1, wherein creating the free surface above the channel region induces relaxation of strain in the first crystalline semiconductor layer disposed below the channel region.

3. The method of claim 1, wherein creating the free surface above the channel region comprises removing the sidewall spacer.

4. The method of claim 1, wherein creating the free surface above the channel region comprises amorphizing and annealing at least a portion of the gate electrode.

5. The method of claim 1, wherein the gate electrode comprises an amorphous material and creating the free surface above the channel region comprises thermally annealing the gate electrode.

6. The method of claim 1, further comprising forming a strain-inducing overlayer above the first crystalline semiconductor layer.

7. A method for forming a structure, the method comprising:
    forming a first crystalline semiconductor material over a substrate, the first crystalline semiconductor material being strained and having a first lattice constant;
    forming a second crystalline semiconductor material over the first crystalline semiconductor material, the second crystalline semiconductor material having a second lattice constant different from the first lattice constant, the second crystalline semiconductor material having a first strain; and
    relaxing strain in a first portion of the first crystalline semiconductor material and inducing strain in a first portion of the second crystalline semiconductor material to a second strain, the second strain being greater than the first strain, the first portion of the second crystalline semiconductor material overlying the first portion of the first crystalline semiconductor material.

8. The method of claim 7, wherein the step of relaxing strain and inducing strain comprises:
performing an amorphization implant in a second portion of the first crystalline semiconductor material and a second portion of the second crystalline semiconductor material to form the second portion of the first crystalline semiconductor material into a first amorphized material and to form the second portion of the second crystalline semiconductor material into a second amorphized material; and
annealing the first amorphized material and the second amorphized material.

9. The method of claim 7, wherein the step of relaxing strain and inducing strain comprises defining a free surface in the first crystalline semiconductor material and the second crystalline semiconductor material.

10. The method of claim 7, wherein the step of relaxing strain and inducing strain comprises etching a recess in the first crystalline semiconductor material and the second crystalline semiconductor material.

11. The method of claim 7, further comprising forming a gate structure over the second crystalline semiconductor material, the gate structure comprising a third crystalline material, wherein the step of relaxing strain and inducing strain comprises:
performing an amorphization implant in the third crystalline material to form the third crystalline material into an amorphized material; and
annealing the amorphized material.

12. The method of claim 7, wherein the first crystalline semiconductor material comprises an alloy of silicon and germanium, and wherein the second crystalline semiconductor material consists essentially of silicon.

13. The method of claim 7 further comprising forming a relaxed third material adjacent the first portion of the second crystalline semiconductor material and the first portion of the first crystalline semiconductor material.

14. The method of claim 7, wherein the substrate comprises silicon.

15. A method for forming a structure, the method comprising:
forming a first crystalline semiconductor material over a substrate, the first crystalline semiconductor material being strained and having a first lattice constant;
forming a second crystalline semiconductor material over the first crystalline semiconductor material, the second crystalline semiconductor material having a second lattice constant different from the first lattice constant;
forming a gate structure over the second crystalline semiconductor material, the gate structure defining a region underlying the gate structure;
amorphizing a portion of the gate structure, a portion of the first crystalline semiconductor material, and a portion of the second crystalline semiconductor material, the portion of the first crystalline semiconductor material and the portion of the second crystalline semiconductor material being at least part of a source/drain region proximate the region underlying the gate structure; and
annealing the portion of first crystalline semiconductor material and the portion of the second crystalline semiconductor material.

16. The method of claim 15, wherein the forming the gate structure comprises forming a sidewall spacer laterally adjacent to a gate electrode, wherein after the amorphizing and before the annealing, the sidewall spacer is removed.

17. The method of claim 15, wherein the first crystalline semiconductor material comprises an alloy of silicon and germanium, and wherein the second crystalline semiconductor material consists essentially of silicon.

18. The method of claim 15, wherein the substrate comprises silicon.

19. A method for forming a structure, the method comprising:
forming a first crystalline semiconductor material over a substrate, the first crystalline semiconductor material being strained and having a first lattice constant;
forming a second crystalline semiconductor material over the first crystalline semiconductor material, the second crystalline semiconductor material having a second lattice constant different from the first lattice constant;
forming a gate structure over the second crystalline semiconductor material, the gate structure comprising a third crystalline material;
performing an amorphization implant in a first portion of the first crystalline semiconductor material, a first portion of the second crystalline semiconductor material, and the third crystalline material to form the first portion of the first crystalline semiconductor material into a first amorphized material, the first portion of the second crystalline semiconductor material into a second amorphized material, and the third crystalline material into a third amorphized material; and
annealing the first amorphized material, the second amorphized material, and the third amorphized material.

20. The method of claim 19, wherein the performing the amorphization implant and the annealing relaxes strain in a second portion of the first crystalline semiconductor material and induces strain in a second portion of the second crystalline semiconductor material, the second portion of the second crystalline semiconductor material overlying the second portion of the first crystalline semiconductor material.

21. The method of claim 19, wherein the first crystalline semiconductor material comprises an alloy of silicon and germanium, and wherein the second crystalline semiconductor material consists essentially of silicon.

* * * * *